United States Patent [19]

Sullivan

[11] Patent Number: 4,959,792

[45] Date of Patent: Sep. 25, 1990

[54] HARNESS INTEGRITY TESTER (HIT)

[76] Inventor: Thomas P. Sullivan, 10427 W. Calle de Plata, Phoenix, Ariz. 85039

[21] Appl. No.: 95,016

[22] Filed: Sep. 10, 1987

Related U.S. Application Data

[63] Continuation-in-part of Ser. No. 822,212, Jan. 24, 1986, abandoned.

[51] Int. Cl.⁵ .................. G05B 23/02; G01R 19/25
[52] U.S. Cl. .................... 364/579; 324/66; 324/555; 340/651; 364/481; 371/20.1
[58] Field of Search .................. 364/481–483, 364/579; 324/66, 73 R, 523, 525, 539, 540, 555; 371/18, 22, 25, 29; 340/651

[56] References Cited

U.S. PATENT DOCUMENTS

| | | | |
|---|---|---|---|
| 3,982,180 | 9/1976 | Vaiden | 324/66 |
| 3,986,106 | 10/1976 | Shuck et al. | 324/540 |
| 4,224,690 | 9/1980 | Rockwell | 324/540 |
| 4,277,740 | 7/1981 | Parks | 324/540 |
| 4,375,050 | 2/1983 | Helgerson | 324/66 |
| 4,418,312 | 11/1983 | Figler et al. | 324/540 |
| 4,471,293 | 9/1984 | Schnack | 324/66 |
| 4,581,577 | 4/1986 | Nowosad et al. | 324/66 |
| 4,608,531 | 8/1986 | Stephens | 324/73 R |
| 4,620,282 | 10/1986 | Shelley | 324/66 |
| 4,689,551 | 8/1987 | Ryan et al. | 340/651 |
| 4,772,845 | 9/1988 | Scott | 324/66 |

FOREIGN PATENT DOCUMENTS

| | | |
|---|---|---|
| 008954 | 3/1980 | European Pat. Off. . |
| 164570 | 12/1985 | European Pat. Off. . |
| 439397 | 4/1980 | France . |
| 813327 | 3/1981 | U.S.S.R. ............ 324/66 |

OTHER PUBLICATIONS

Excerpt from Patent Abstracts of Japan, vol. 6, No. 30, (P-103)(908), Feb. 2, 1982; JP-A-56 150 323 (Nippon Denki K.K.) 20-11-1981.

Excerpt from Patent Abstracts of Japan, vol. 10, No. 132, (P-456)(2189), May 16, 1986; JP-A-60 253 947, (Fujitsu K.K.), 14-12-1985.

Primary Examiner—Kevin J. Teska
Attorney, Agent, or Firm—Cahill, Sutton & Thomas

[57] ABSTRACT

A method and apparatus for determining the conductive integrity of a plurality of lines which transmit electromagnetic radiation.

6 Claims, 9 Drawing Sheets

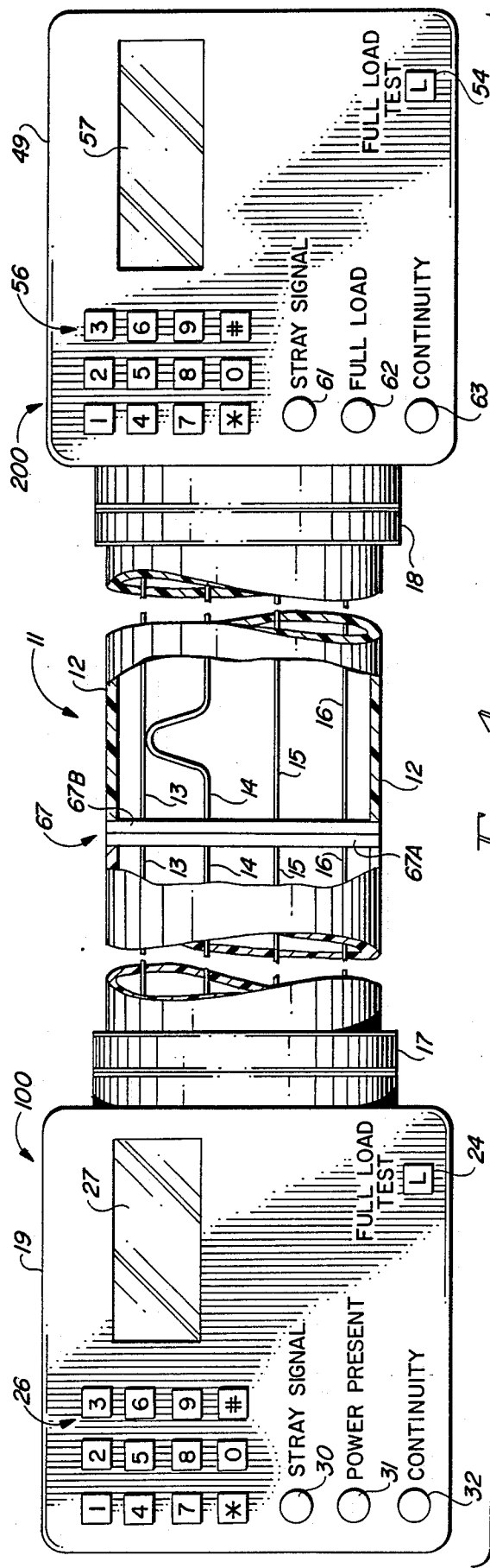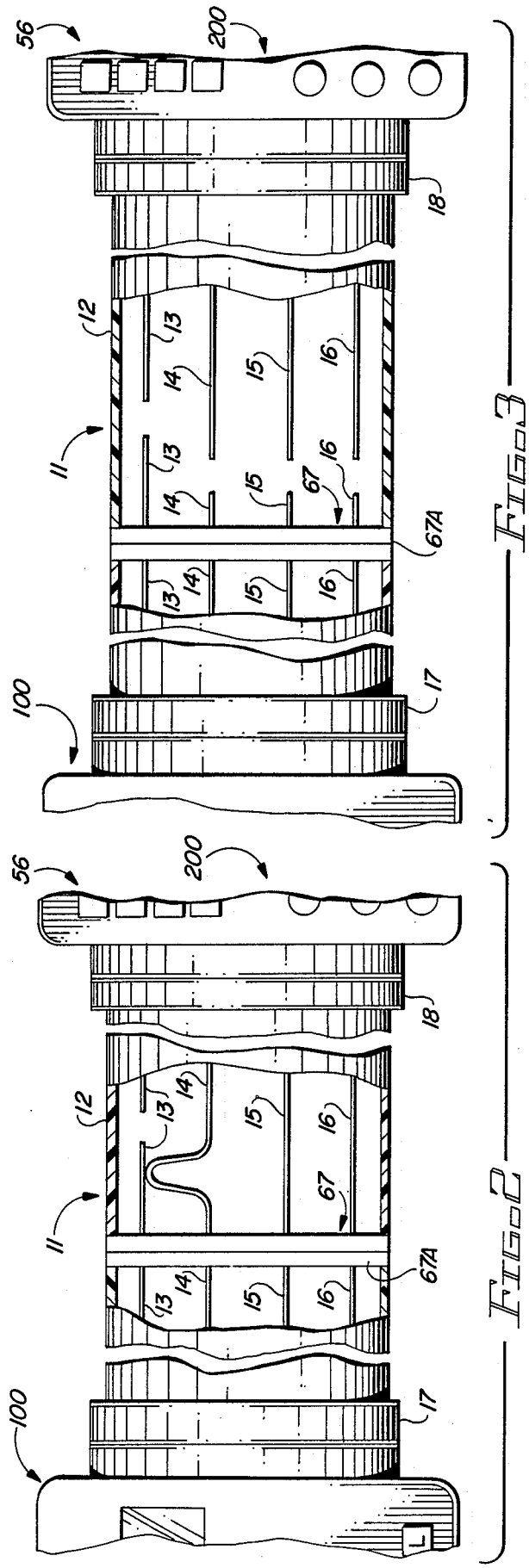

CURRENT CARRYING CAPACITY OF WIRES (AS PERCENTAGE OF CURRENT CARRYING CAPACITY WHEN NOT DAMAGED)

TIME WIRE IN USE (YEARS)

HARNESS INTEGRITY TESTER (HIT)

CROSS REFERENCE TO RELATED APPLICATION

The present application is a continuation-in-part of applicant's co-pending prior application Ser. No. 06/822,212, filed Jan. 24, 1986, and entitled "Harness Integrity Tester (HIT)", which application is now abandoned.

This invention pertains to a method and apparatus for determining the conductive integrity of a plurality of lines which transmit electromagnetic radiation.

More particularly, the invention pertains to a method and apparatus for determining the conductive integrity of multiple wire cables or harnesses which line the fuselage and wings of sophisticated modern day jet aircraft.

In a further respect, the invention pertains to a method and apparatus for evaluating the conductive integrity of aircraft harnesses without requiring that computers associated with the harnesses be removed from the aircraft for testing, and without requiring the employment of a highly trained electrical engineer or technician.

In another respect, the invention pertains to a method and apparatus for determining the conductive integrity of an electromagnetic radiation transmission line which can be utilized by a lay person having minimal training concerning fundamental principles of electricity and fault isolation.

In still a further respect, the invention pertains to apparatus for determining the conductive integrity of an electromagnetic radiation transmission line, the apparatus being of inexpensive simple construction which permits ready hardening of the apparatus for protection against user abuse, and environmental conditions including radiation which would be present during a nuclear war.

The fuselage and wings of sophisticated aircraft utilized in the U.S. Army, Navy, Air Force and Marines are lined with multiple wire cables. These cables often include over twenty parallel electrically insulated wires extending the length of the cable. The cables typically pass through bulkhead connectors and are secured to at least one structural support member in the fuselage or wings of an aircraft. Each end of a cable is provided with a cannon plug. The cannon plug contains pins or pin sockets each connected to one of the wires in the cable. The cost, both in terms of manpower and equipment involved in the conventional process of troubleshooting defective cables is substantial.

When an aircraft cable does not appear to be functioning properly, conventional maintenance procedures dictate removal of the on-board computer or line replaceable unit (LRU), operatively associated with the cable. The computer or LRU is transported to a maintenance depot for testing. The depot is equipped with large, sophisticated main line computers and with other auxilliary testing equipment. If the on-board computer or LRU is diagnosed as functioning properly, then the cable is removed and replaced, or a specially trained technician or engineer is dispatched to troubleshoot the cable and isolate the malfunction. If the cable consists of only four wires for conducting electricity, then it typically takes an expert electrician approximately one hour to properly troubleshoot the cable while the cable is in the aircraft. Large harnesses in jet aircraft sometimes have in excess of one hundred wires. Troubleshooting such cables takes many hours.

Removing a faulty cable, transporting the cable to a maintenance depot, and installing a new cable in an aircraft is also a time consuming approach for dealing with cable malfunctions. Aircraft cables often pass through a plurality of mounted bulkhead Adel clamps inside the fuselage and wings of an aircraft. Consequently, disassembling an aircraft to remove a cable can require many man hours.

Experts who can effectively troubleshoot cable failures in aircraft must be highly trained and typically are civilians retained at substantial cost to the military. Such expert would be difficult to provide during actual combat condition when prompt repair of aircraft would be essential.

One of the principal reasons for the length of time presently required for an expert electrician to field test the integrity of aircraft cables is the unstable measuring environment dictated by the characteristics of the cables. During conventional troubleshooting procedures, an expert electrician utilizes a meter to measure electrical current present in each wire in the cable. During this procedure, one of the meter probes is placed on a pin or pin socket which is attached to the end of the wire being tested. Since there are often many wires in a single cable and, therefor, many pins or pin socket in a cannon plug at the end of the cable, it is difficult for an electrician to identify which pin or socket is connected to the particular wire the electrician wishes to test. Furthermore, since the pins or pin sockets are usually closely spaced, it is also difficult to only contact a single pin or pin socket with the meter probe. Finally, in order to properly test the integrity of each wire in a cable, an expert electrician must attach a load, i.e., a resistance, to one end of the wire and direct through the wire a current for which the wire is rated. Attaching a resistance load to the proper pin or socket in a cannon plug at the end of a cable is, for the reasons already noted in connection with the use of a meter probe, a time consuming and dangerous process.

The meters utilized by an electrician during the field testing of cables are susceptible to being damaged or rendered inoperative due to the misapplication or misuse of meter control functions. The cost of effectively hardening meter components against radiation damage is prohibitive.

Accordingly, it would be highly desirable to provide a method and apparatus for testing the integrity of aircraft cables which would not require the services of specially trained expert electricians, would not require the removal and depot testing of on-board aircraft computers or LRUs, would offer a secure measuring environment, would be inexpensive in use and manufacture, would minimize the cases in which a cable would have to be removed from an aircraft, would permit effective field maintenance of cables under combat conditions, could be utilized by eighteen and nineteen year old servicemen having minimal training in the fundamentals of electricity, and which could be readily utilized in a radiation filled environment resulting from a nuclear war.

Therefor, it is a principle object of the invention to provide an improved method and apparatus for testing the conductive integrity of aircraft harnesses and of bundles of electromagnetic radiation transmission lines in general.

Another object of the invention is to provide apparatus which can be used to field test the conductive integrity of an aircraft cable without requiring the removal and testing of on-board aircraft computers or LRUs and which minimizes the situations in which a cable has to be removed from an aircraft and replaced.

A further object of the invention is to provide apparatus which can be utilized by teenaged servicemen to field test the conductive integrity of an aircraft cable, the servicemen having minimal training in the fundamentals of electricity.

Still another object of the invention is to provide apparatus of the type described which is of inexpensive manufacture and can be readily utilized in a radiation filled environment resulting from a nuclear war.

These and other, further and more specific objects and advantages of the invention will be apparent to those skilled in the art from the following detailed description thereof, taken in conjunction with the drawings, in which:

FIG. 1 is a top view illustrating apparatus constructed in accordance with the principles of the invention and connected to an aircraft harness for testing the conductive integrity thereof;

FIG. 2 is a top view illustrating an aircraft harness attached to testing apparatus of the invention, the harness having structural faults affecting the conductive integrity thereof;

FIG. 3 is a top view illustrating a severed aircraft harness attached to testing apparatus of the invention;

Figure 4:
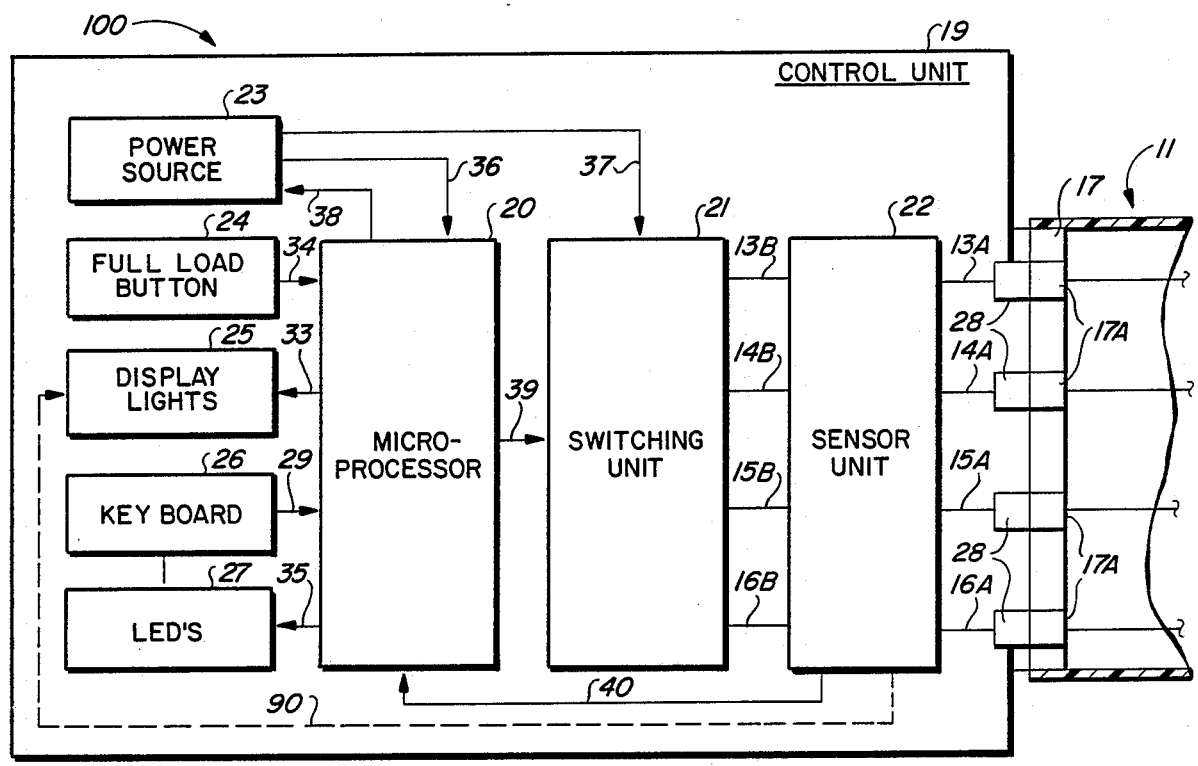
FIG. 4 is a schematic diagram illustrating operatively associated components of the control unit of the apparatus of the invention; and, FIG. 5 is a schematic diagram illustrating operatively associated components of the detector unit of the apparatus of the invention.

Briefly, in accordance with my invention, I provide means for testing the conductive integrity of a plurality of transmission lines for conducting electromagnetic radiation. Each of the transmission lines has a first end and a second end and is adapted to accept as input at the first end a quantity of electromagnetic radiation; to conduct through the line to the second end transmitted electromagnetic radiation derived from the input electromagnetic radiation; and, to produce as output at the second end transmitted electromagnetic radiation in desired proportion to the input electromagnetic radiation. Electromagnetic radiation input into one of the transmission lines normally only produces output transmitted electromagnetic radiation at the second end of the transmission line and does not produce output electromagnetic radiation at the second end of transmission lines other than said one of the transmission lines. The second end of each of the transmission lines includes connector means shaped, contoured and dimensioned to conductively mate with receiver means normally operatively associated with the transmission line such that the receiver means receives a desired portion of the output of transmitted electromagnetic radiation from the second end of the transmission line. The means for testing the conductive integrity of the transmission lines includes control unit means in communication with a selected one of the transmission lines to introduce a selected quantity of electromagnetic radiation into the first end of the selected transmission line; and, detector means including means conductively coupling the detector means to the connector means on the second end of each of the transmission lines to receive a portion of the output transmitted electromagnetic radiation generally equivalent to the portion received by the receiver means normally operatively associated with the transmission line. The receiver means is disconnected from the connector means of the transmission line during utilization of the testing means. The detector means, independently of the control unit means, identifies each of the transmission lines; receives and monitors the output of transmitted electromagnetic radiation at the second end of each of the transmission lines; when electromagnetic radiation is input to the first end of the selected transmission line, determines if the output of transmitted electromagnetic radiation at the second end of the selected transmission line is in the desired proportion to the input of electromagnetic radiation and to determine if there is output of electromagnetic radiation at the second ends of the transmission lines other than the selected line; and, indicates whether the output of the selected transmission line is in the desired proportion to the input electromagnetic radiation, and whether there is output of transmitted electromagnetic radiation at the second ends of the transmission lines other than the selected line.

Turning now to the drawings, which depict the presently preferred embodiments of the invention for the purpose of illustrating the practice thereof and not by way of limitation of the scope of the invention, and in which like reference characters represent corresponding elements throughout the several views, FIGS. 1-5 illustrate apparatus for testing the conductive integrity of lines for transmitting electromagnetic radiation such as cosmic-ray photons, gamma rays, x-rays, ultraviolet radiation, visible light, infrared radiation, microwaves, radio waves, heat and electric current. Cable 11 includes insulative sheathing 12 circumscribing transmission lines or electrically conductive wires 13, 14, 15 and 16 which extend the length of line 11. Each wire 13-16 has a first end and a second end. The first end is secured to and includes connector unit 17. The second end is secured to and includes connector unit 18. Connector unit 17 typically comprises a cannon plug having a pin or pin socket attached to each wire 13–16. For purposes of this description, it is assumed connector unit 17 is a cannon plug having a pin socket 17A attached to each wire 13–16. Connector unit 18 also typically comprises a cannon plug having a pin or pin socket attached to each wire 13–16. For purposes of this description, it is assumed connector unit 18 is a cannon plug having a pin socket 18A attached to each wire 13–16. The control unit (CU) of the testing apparatus of the invention is generally designated by reference character 100 and includes a housing 19 carrying microprocessor 20, switching unit 21, sensor unit 22, power source 23, spring-loaded full load button 24, display lights 25, push button keyboard 26, LED readout 27 and connector means adapted to securely interfit with the existing cannon plug 17 of wire 11 to provide a stable measuring environment and to duplicate the desired continuity of connection between plug 17 and a mating connector unit. As utilized herein, the term "continuity of connection" refers to the losses in electromagnetic radiation which occur when the electromagnetic radiation moving through a line travels through a connection or juncture such as a pin—pin socket connection. The connections offering the best continuity of connection are those which cause the smallest loss of electromagnetic radiation when the radiation travels through the connection. The connector means of the control unit includes pins 28 shaped and dimensioned to slidably interfit into pin sockets 17A of cannon plug 17. Each pin 28 is connected to one of wires 13A, 14A, 15A, 16A leading to sensor unit 22. Wires 13B, 14B. 15B, 16B interconnect switching unit 21 and sensor unit 22. Wires 13A–16A receive electromagnetic radiation signals entering control unit (CU) 100 through connectors 17A, 28 from wires 13–16, respectively. Electromagnetic radiation entering sensor unit 22 through wires 13A–16A exits through wires 13B–16B, respectively. Keyboard 26 includes twelve spring loaded buttons labelled in the same manner as the twelve push buttons on a conventional telephone. Each of the spring loaded buttons on the CU 100 is normally maintained in an "OFF" position. When a button in keyboard 26 is depressed a signal 29 to microprocessor 20 is generated. As soon as finger pressure on a button in keyboard 26 is released, the button moves upwardly to its normal "OFF" position. Full Load Test button 24 is also spring loaded and is normally in an "OFF" position. Depressing button 24 displaces it to the "ON" position. Once finger pressure on button 24 is released, the button moves upwardly to its normal "OFF" position. The display lights 25 include red stray signal indicator 30, green power present indicator 31, and amber continuity indicator 32. Display lights 25 are controlled 33 by microprocessor 20. When Full Load Test button 24 is depressed and held for two seconds it causes a signal 34 to be sent to microprocessor 20. LED readout 27 produces an alphanumeric readout on command 35 from microprocessor 20. Power source 23 is presently preferably a battery internally mounted inside housing 19 of CU 100. However, power can be supplied to CU 100 by any other appropriate internal or external source. Microprocessor 20 receives signals 36 from monitoring circuitry inside power source 23 indicating the operational status of source 23 and its ability to deliver to switching unit 21 the quantity of power required by microprocessor 20. Microprocessor 20 controls 38 the amount of power transmitted 37 by power source 23 to switching unit 21. When a particular wire 13–16 is selected for continuity testing by depressing the appropriate buttons in keyboard 26, microprocessor 20 commands 39 switching unit 21 such that power 37 from source 23 is directed through switching unit 21 and onto the wire 13–16 selected at keyboard 26. Sensor unit 22 provides 40 microprocessor 20 with data indicating the quantity or other physical characteristic which indicates either the quantity and/or quality of the electromagnetic radiation traveling along wires 13–16.

The detector unit (DU) of the testing apparatus of the invention is generally designated by reference character 200 and includes a housing 49 carrying microprocessor 50, sensor unit 52, spring-loaded Full Load Test button 54, display lights 55, push button keyboard 56, LED readout 57, and connector means adapted to securely interfit with the cannon plug 18 of wire 11 to provide a stable measuring environment and to provide the desired continuity of connection with plug 18. The connector means of the detector unit (DU) 200 includes pins 59 shaped and dimensioned to slidably interfit into pin sockets 18A of cannon plug 18. Each pin 59 is connected to one of wires 13C, 14C, 15C, 16C leading to sensor unit 52. Wires 13C, 14C, 15C, 16C receive electromagnetic radiation entering DU 200 through connectors 18, 59 from wires 13–16, respectively. Electromagnetic radiation entering sensor unit 52 through wires 13C–16C exits sensor unit 52 through wires 13D–16D, respectively. Wires 13D–16D interconnect sensor unit 52 and switching unit 69. Microprocessor 20 controls 70 switching unit 69. Keyboard 56 includes twelve spring loaded buttons labelled in the same manner as the twelve buttons on a conventional push button telephone. Each of the DU push buttons is normally in the "OFF" position. When a push button in keyboard 56 is depressed, a signal 60 to microprocessor 50 is generated. As soon as finger pressure on a push button in keyboard 56 is released, the button moves upwardly to its normal "OFF" position. Full Load Test button 54 is also spring loaded and is normally in an "OFF" position. Depressing button 54 displaces it to the "ON" position. Once finger pressure on button 54 is released, the button moves upwardly to its normal "OFF" position. Display lights 55 include red stray signal indicator 61, green full load indicator 62, and amber continuity indicator 63. Display lights 55 are controlled 68 by microprocessor 50. When Full Load Test button 54 is depressed and held for two seconds, it causes a signal 64 to be sent to microprocessor 50. LED readout 57 produces an alphanumeric readout on receiving a command 65 from microprocessor 50. When a particular wire 3–16 is selected for testing by making the appropriate entry on keyboard 56, microprocessor 50 receives signals 66 from sensor unit 52 indicating either the quantity or other physical characteristics which indicate the quantity and/or quality of electromagnetic radiation passing through wires 13–16.

The operation of the apparatus of the invention is, with reference to FIGS. 1 to 3, further illustrated below in TABLES I–III. TABLES I–III each describe the apparatus of the invention being utilized to troubleshoot a four wire cable having at least one continuity fault, where the continuity fault can be a severed wire, wire shorted to another wire, or a dead short to ground. For purposes of the troubleshooting procedures described below in TABLES I–III it is assumed the cable 11 is in a present day jet aircraft, includes at least one bulkhead connector 67 therein, has a first end including cannon plug 17, and has a second end including cannon plug 18.

Prior to the testing procedures of TABLES I-III, cannon plug 17 is disconnected from its mating connector in the aircraft and is connected to the CU 100 in the manner depicted in FIG. 1. The mating connector of plug 17 in the aircraft is typically associated with a computer or LRU. The connector means in CU 100 is essentially a duplicate of the aircraft mating connector and includes four pins which each slidably interfit with one of the four pin sockets of cannon plug 17 to provide a connection with cannon plug 17 which produces a high continuity of connection and causes minimal losses of electromagnetic radiation when radiation from wires 13-16 travels through the pin—pin socket connections into or from CU 100.

Similarly, prior to the testing procedures of TABLES I-III, cannon plug 18 is disconnected from its mating connector in the aircraft, and is connected to the DU 200 in the manner depicted in FIG. 1. The mating connector of plug 18 in the aircraft is typically associated with a computer or LRU. The connector means in the DU 200 is essentially a duplicate of the aircraft mating connector and includes four pins which each slidably interfit with one of the four pin sockets of cannon plug 18 to provide a connection with cannon plug 18 which produces a high continuity of connection and causes minimal losses of electromagnetic radiation when radiation from wires 13-16 travels through the pin—pin sockets into or from DU 200.

TABLE I describes one possible trouble shooting sequence which can occur when wires 13-16 in cable 11 are continuous and when wire 14 is shorted to wire 13. This is the condition of cable 11 illustrated in FIG. 1.

TABLE II describes one possible trouble shooting sequence which can occur when wires 14-16 are continuous, wire 13 is severed, and wire 14 is shorted to wire 13. This is the condition of cable 11 illustrated in FIG. 2.

TABLE III describes one possible trouble shooting sequence which can occur when wires 13-16 are severed. This is the condition of cable 11 illustrated in FIG. 3.

In TABLES I-III reference is made to alphanumeric readouts on the CU LED readout 27 and the DU LED readout 57. The meaning of these readouts is as follows:

| Readout | Meaning |
|---------|---------|
| PT | Pin test |
| DS | Dead short |
| SS | Stray signal |
| SP | Signal present |
| FL | Full load |

When numerals appear in the readouts, the numerals indicate the wire associated with the particular letter readout. Letter readouts generally always occur in conjunction with a numerical readout For example, "PT 13" means wire 13 is being tested; "SS 14" means there is a stray signal (short) on wire 14; "SP 15" means there is a signal present on wire 15.

TABLE I

Test Procedure for Cable 11 of FIG. 1. Wires 13-16 Continuous and Wire 14 Shorted to Wire 13

Step 1

To test wire 13, the "1" and "3" buttons are sequentially depressed on keyboard 26 of CU 100. When the "1" and "3" buttons are depressed, signal 29 is received by microprocessor 20 which commands 38 power source 23 to send 37 a small current, typically three to thirty milliamps (ma), to switching unit 21. Microprocessor 20 also commands 39 switching unit 21 to direct the small current over line 13B. The signal directed onto line 13B by unit 21 passes through sensor unit 22, line 13A, connectors 28 and 17A, and into wire 13.

Step 2

As part of the procedure for testing wire 13, the "1" and "3" buttons are sequentially depressed on keyboard 56 of detector unit (DU) 200. When the "1" and "3" buttons are depressed, signal 60 is received by microprocessor 50. The small current directed into wire 13 by CU 100 travels along wire 13, through connectors 18A and 59, and into sensor unit 52. The short of wire 14 to wire 13 permits the signal from line 13 to travel through wire 14 and connectors 18A and 59 into wire 14C and sensor unit 52. The signal passing through wire 14 also travels through connectors 17A and 28 into line 14A and sensor unit 22. Signal 66 from sensor unit 52 to DU microprocessor 50 indicates that small currents are flowing through lines 13C and 14C and that no current is passing through lines 15C and 16C. Sensor unit 22 of CU 100 informs 40 microprocessor 20 that a small current is flowing through lines 13A and 14A and that no current is passing through lines 15A and 16A. After receiving the afore-mentioned data, microprocessors 20 and 50 direct 35, 65 LED readouts 27 and 57, respectively, and direct 33, 68 display lights 25, 55 to read as indicated below.

a. Readings on control (CU) 100:
(1) LED readout 27 reads, in sequence: "PT 13", "SS 14". There are no readouts pertaining to wires 15 and 16 because sensor unit 22 does not detect any current flowing through wires 15A and 16A.
(2) Red indicator light 30 is on because of the signal received by the CU over line 14A. Microprocessor 20 knows wire 13 is being tested. Accordingly, when sensor unit 22 detects the flow of current through wire 14A, microprocessor 20 knows there is a stray signal in wire 14A and that wire 14 is shorted to wire 13. Microprocessor consequently causes red indicator light 30 to illuminate.
(3) Green indicator light 31 is on because internal power source 23 circuitry indicates 36 to microprocessor 20 that power source 23 is in the proper operative condition and is delivering a small three to thirty ma current to switching unit 21.
(4) Amber indicator light 32 is off because there is no built-in jumper connection in cannon plug 17 between wire 13 and one of the other wires. If there were a built-in jumper connection, say between wire 13 and wire 15, this information would be programmed into microprocessor 20 which would, on receiving an indication 40 from sensor unit 22 that current was passing through wire 15A when current was directed through wire 13A, (a) command 33 amber indicator light 32 to illuminate, and
(b) command 35 the LED readout 27 to read, in sequence: "PT 13", "SS 14", "SP 15".
(5) The Full Load Test button 24 is in the "OFF" position because a full load test is not being performed.
b. Readings on detector unit (DU) 200:
(1) LED readout 57 reads, in sequence: "SP 13, SS 14". There are no readouts pertaining to wires 15 and 16 because sensor unit 52 does not detect any current flowing through wires 15C and 16C.
(2) Red indicator light 61 is on because of current flow detected by sensor unit 52 over line 14C. Microprocessor 50 knows wire 13 is being tested. Accordingly, when sensor unit 52 detects the flow of current through wire 14C, microprocessor 50 knows there is a stray signal in wire 14C and that wire 14 is shorted to wire 13. Microprocessor 50 consequently causes red indicator light 61 to illuminate.
(3) Amber indicator light 63 is on because of the signal in line 13C detected by sensor unit 52. When sensor unit 52 indicates 66 to microprocessor 50 that a current flow exists in wire 13C, microprocessor 50 commands the amber indicator light 63 to illuminate. Light 63 illuminates when there is a signal present in the wire being tested.
(4) Green indicator light 62 is off because the full load test is not being performed.
(5) The Full Load Test button 54 is in the "OFF" position because the full load test is not being performed. When the red indicator light 61 on the DU 200 is on, microprocessor 50 inhibits the DU from performing a full load check by not directing switching unit 69 to place a load, i.e., a resistance, on a wire 13D–16D to permit a larger current to be directed into the wire to test the load carrying capacity of the wire. If red indicator light 61 is on, then microprocessor 50 inhibits the performance of the full load test even when Full Load Test button 54 is depressed to the "ON" position.

RESULT: Based on the above readings, the technician utilizing the testing equipment of the invention knows that wire 14 is shorted to wire 13 and that wires 13 and 14 have a minimal amount of conductive continuity and are not severed.

SUBSEQUENT MAINTENANCE PROCEDURE: Remove and replace cable 11; connect CU or DU at other points along length of cable to isolate short location, for instance, separate cable 11 at bulkhead connector 67, disconnect DU 200 from cannon plug 18, connect DU to bulkhead connector 67A, and repeat test of wire 13; or, after the "1" and "3" buttons are depressed on keyboards 26 and 56, move cable 11 at various points therealong to attempt to locate the short. If cable 11 is moved near the location of the short, wire 14 often momentarily separates from wire 13, causing the flow of current from wire 13 through wire 14 to stop. When the flow of current into wire 14C consequently stops, sensor unit 52 notifies microprocessor 50 which turns off 68 red indicator light 61. If light 61 turns off when cable 11 is moved at a particular point, then a technician(s) utilizing the CU and DU knows the location of the short.

NOTE: When the number of a wire being tested is entered into keyboard 26, 56 of CU 100 or DU 200, this information is maintained in the memory of microprocessors 20, 50 respectively, and that wire is the wire over which a small current, or, during the full load test, a larger current, is directed. The CU 100 will direct current over another wire only after a new number is entered in keyboard 26.

Step 3

The "1" and "5" buttons are sequentially depressed on keyboard 26 of CU 100. When the "1" and "5" buttons are depressed, signal 29 is received by microprocessor 20 which notes that wire 15 is being tested and commands 38 power source 23 to send 37 a small current, typically three to thirty milliamps (ma), to switching unit 21. Microprocessor 20 also commands switching unit 21 to direct the small current over line 15B. The signal directed onto line 15B by unit 21 passes through sensor unit 22, line 15A, connectors 28 and 17A, and into wire 15.

Step 4

The "1" and "5" buttons are sequentially depressed on keyboard 56 of detector unit (DU) 200. When the "1" and "5" buttons are depressed, signal 60 is received by microprocessor 50, which notes that wire 15 is being tested. The small current directed into wire 15 by switching unit 21 of CU 100 travels along wire 15, through connectors 18A and 59, and into sensor unit 52. Signal 66 from sensor unit 52 to DU microprocessor 50 indicates that a small current is flowing through line 15C and that there is no current flowing through lines 13C, 14C and 16C. Sensor unit 22 of CU 100 informs microprocessor 20 that a small current is flowing through line 15A and that no current is flowing through lines 13A, 14A and 16A. After receiving the aforementioned data, microprocessors 20 and 50 direct 35, 65 LED readouts 27 and 57, respectively, and direct 33, 68 display lights 25, 55 to read as indicated below.
a. Readings on control unit (CU) 100:
(1) LED readout 27 reads, in sequence: "PT 15". There are no readouts pertaining to wires 13, 14, 16 because sensor unit 22 does not detect any current flowing through these wires.
(2) Red indicator light 30 is off because sensor unit 22 does not detect any current flowing through wires other than wire 15. Microprocessor 20 knows wire 15 is being tested and should be transmitting a current.
(3) Green indicator light 31 is on because internal power source 23 circuitry indicates 36 to microprocessor 20 that power source 23 is in the proper operative condition and is delivering a small three to thirty ma current to switching unit 21.
(4) Amber indicator light 32 is off because there is no built-in jumper connection in cannon plug 17 between wire 13 and one of the other wires.
(5) The Full Load Test button 24 is in the "OFF" position because a full load test is not being performed.
b. Readings on detector unit (DU) 200:
(1) LED readout 57 reads, in sequence: "SP 15". There are no readouts pertaining to wires 13, 14 and 16 because sensor unit 52 does not detect any current flowing through wires 13C, 14C and 16C. Sensor unit 52 notifies 66 microprocessor 50 that there is no current flowing through wires 13C, 14C and 16C and, consequently, microprocessor 50 does not cause LED readout 57 to display any information concerning wires 13, 14 and 16.

(2) Red indicator light 61 is off because there is no current flow detected by sensor unit 52 over lines 13C, 14C and 16C. Sensor unit 52 notifies 66 microprocessor 50 that there is not current flowing through wires 13C, 14C and 16C and, consequently, microprocessor 50 does not cause LED readout 57 to display any information concerning wires 13, 14 and 16.

(3) Amber indicator light 63 is on because of the current flow in line 15C detected by sensor unit 52. When sensor unit 52 indicates 66 to microprocessor 50 that a current flow exists in wire 15C, microprocessor 50 commands the amber indicator light 63 to illuminate. Light 63 illuminates when there is a signal present in the wire being tested.

(4) Green indicator light 62 is off because the full load test is not being performed.

(5) The Full Load Test button 54 is in the "OFF" position because a full load test is not being performed.

RESULT: Based on the above readings resulting after Steps 3 and 4, the technician utilizing the testing equipment of the invention knows that wire 15 is not shorted to wires 13, 14, 16 and that wire 15 at least has a minimal amount of conductive continuity, i.e., knows that wire 15 is not completely severed.

SUBSEQUENT MAINTENANCE PROCEDURE: Perform full load test described below in Steps 5-8.

Step 5

Depress the "#" button on keyboard 26. The "#" button must be depressed in order for microprocessor 20 to permit a full load test to be performed on wire 15.

Step 6

Depress and hold the Full Load Test button 24 in the "ON" position. After the "#" button and button 24 are depressed, microprocessor 20 receives signals 29, 34 verifying that the "#" button has been pushed and that button 24 is being held in the "ON" position. Microprocessor 20 then commands power source 23 to provide switching unit 21 with a large current, typically three to ten amps. Microprocessor 20 also commands 39 switching unit 21 to direct the current from power source 23 over line 15B. The signal on line 15B passes through sensor unit 22, lines 15A, connectors 28 and 17A, and into wire 15. This current signal travels through wire 15 to the DU 200.

Step 7

Depress the "#" button on keyboard 56. The "#" button must be depressed in order for the microprocessor 50 to permit a full load test to be performed on wire 15.

Step 8

Depress and hold the Full Load Test button 54 in the "ON" position. After the "#" button and button 54 are depressed, microprocessor 50 receives the signals 60, 64 verifying that the "#" button has been pushed and that button 54 is being held in the "ON" position. Microprocessor 50 then commands 70 switching unit 69 to place an appropriate load (resistance) on wire 15D to permit a full load test of wire 15. After Steps 5-8, microprocessors 20 and 50 direct 35, 65 LED readouts 27 and 57, respectively, and direct 33, 68 display lights 25, 55 to read as indicated below.

a. Readings on control unit (CU) 100:

(1) LED readout 27 reads, in sequence: "FL 15". There are no readouts pertaining to wires 13, 14 and 16 because sensor unit 22 does not detect any current flowing into or from these wires.

(2) Red indicator light 30 is off because sensor unit 22 does not detect any current flowing into or from wires other than wire 15. Microprocessor 20 knows wire 15 is being tested and should be transmitting a current.

(3) Green indicator light 31 is on because internal power source 23 circuitry indicates 36 to microprocessor 20 that power source 23 is in the proper operative condition and is delivering a large three- to ten amp current to switching unit 21.

(4) Amber indicator light 32 is off because there is no built-in jumper connection in cannon plug 17 between wire 13 and one of the other wires.

(5) The Full Load Test button 24 is in the "ON" position because a full load test is being performed on wire 15.

b. Readings on detector unit (DU) 200:

(1) LED readout 57 reads, in sequence: "FL 15". There are no readouts pertaining to wires 13, 14 and 16 because sensor unit 52 does not detect any current flowing through wires 13C, 14C and 16C. Sensor unit 52 notifies 66 microprocessor 50 that there is no current flowing through wires 13C, 14C and 16C, and, consequently, microprocessor 50 does not cause LED readout 57 to display any information concerning wires 13, 14 and 16.

(2) Red indicator light 61 is off because there is no current flow detected by sensor unit 52 over wires 13C, 14C and 16C. Sensor unit 52 notifies 66 microprocessor 50 that there is no current flowing through wires 13C, 14C and 16C and, consequently, microprocessor 50 does not cause LED readout 57 to display any information concerning wires 13, 14 and 16.

(3) Amber indicator light 63 is on because of the current flow in wire 15C detected by sensor unit 52. When sensor unit 52 indicates 66 to microprocessor 50 that a current flow exists in wire 15C, microprocessor 50 commands the amber indicator light 63 to illuminate. Light 63 illuminates when there is a signal present in the wire being tested.

(4) Green indicator light 62 is on because the full load test is being performed and wire 15 is carrying the full load. Sensor unit 52 determines the voltage across wire 15. If, for example, the CU 100 is programmed to direct sufficient current into wire 15 to produce twenty-four volts, then the DU microprocessor 50 has this information in its memory, takes into account the voltage drops across connectors 28 and 17A, across bulkhead connector 67, and across connectors 18A and 59, and expects sensor unit 52 to detect a voltage of something less than twenty-four volts. If sensor unit 52 detects the appropriate voltage, microprocessor 50 commands light 62 to illuminate. If sensor unit 52 detects a voltage across wire 15 which is less than the expected voltage, then microprocessor will not command light 62 to illuminate.

(5) The Full Load Test button 54 is in the "ON" position because a full load test is being performed on wire 15.

RESULT: Based on the results of the full load test of Steps 5-8 above, the technician knows that wire 15 has the expected conductive continuity along its entire length, i.e., knows that there are no loose bulkhead connections or other loose connections along wire 15.

SUBSEQUENT MAINTENANCE PROCEDURE: Proceed to testing of any remaining wires. Wire 16 would be tested in the same manner described above in Steps 3-8 for wire 15, with similar results. The full load test of wire 16 would confirm that wire 16 had the expected conductive continuity along its entire length.

TABLE II

Test Procedure for Cable 11 of FIG. 2. Wires 14-16 Continuous; Wire 13 Severed; and, Wire 14 Shorted to Wire 13

Step 1

This is identical to Step 1 in Table I.

Step 2

This is identical to Step 2 in Table I, excepting that since wire 13 is severed, the signal directed into wire 13 by CU 100 never reaches wire 13C of DU 200 and the signal 66 from sensor unit 52 to DU microprocessor 50 indicates a small current flowing through line 14C and no current flowing through lines 13C, 15C and 16C. The readings on the CU 100 and DU 200 after Steps 1 and 2 immediately above are identical to the readings on the CU and DU in TABLE I after Steps 1 and 2 therein, except that on the DU 200:

(1) LED readout 57 reads, in sequence: "SS 14". There are no readouts pertaining to wires 13, 15, 16 because sensor unit 52 does not detect any current flowing through wires 13C, 15C and 16C.

(2) Amber indicator light 63 is off because sensor unit 52 does not detect a signal on line 13C.

RESULT: Based on the above readings, the technician utilizing the testing equipment of the invention knows that wire 14 is shorted to wire 13, that wire 14 has a minimal amount of conductivity and is not severed, and that wire 13 is severed.

SUBSEQUENT MAINTENANCE PROCEDURE: The subsequent maintenance procedure is identical to that noted in TABLE I after Steps 1 and 2.

Steps 3-8

Steps 3-8 are identical to those of TABLE I. The CU 100 and DU readouts, RESULTS, and SUBSEQUENT MAINTENANCE PROCEDURE for Steps 3-8 in TABLE II are identical to those for Steps 3-8 in TABLE I.

NOTE: In the event of a short to ground microprocessor 20 of CU 100 automatically terminates the test of a wire. For example, if wire 16 were shorted to ground, then when buttons "1" and "6" are pushed on keyboard 26, the microprocessor 20 commands switching unit 21 to direct a current from power source 23 into wire 16A. If the current exceeds 100 ma, microprocessor 20 terminates the test of wire 16. When the microprocessor 20 terminates the test of wire 16 because of a dead short, the CU 100 readouts are:

a. LED readout 27 reads, in sequence: "DS 16". (DS=dead short)
b. Red indicator light 30 is off.
c. Green indicator light 31 is on.
d. Amber indicator light is off.
e. Full Load Test button 24 is in the "OFF" position.

As is the case when one wire 13-16 is shorted to another wire 13-16, microprocessor 20 inhibits a full load check when a wire 13-16 is shorted to ground.

TABLE III

Test Procedure for Cable 11 of FIG. 3. Wires 13-16 Severed.

Step 1

Step 1 is identical to Step 1 in TABLE I.

Step 2

The technician grasps a wire extending from DU 200 and touches it to a wire extending from CU 100. The technician can only see the severed ends of wires extending from DU 200 and CU 100 and does not know the identity of any of the wires. For purposes of this discussion it is assumed the technician grasped wire 14 extending from DU 200 and touched it to wire 15 extending from CU 100.

Step 3

The "1" and "3" buttons are sequentially depressed on keyboard 56 of detector unit (DU) 200. When the "1" and "3" buttons are depressed, signal 60 is received by microprocessor 50. Microprocessor 50 notes that wire 13 is being tested. Signal 66 from sensor unit 52 to DU microprocessor 50 indicates that there is no current flowing through lines 13C-16C. Sensor unit 22 of CU 100 informs 40 microprocessor 20 that a small current is flowing through line 13A and that no current is flowing through lines 14A-16A. After receiving the aforementioned data, microprocessors 20 and 50 direct 35, 65 LED readouts 27 and 57, respectively, and direct 33, 68 display lights 25, 55 to read as indicated below.

a. Readings on control unit (CU) 100:
(1) LED readout 27 reads, in sequence: "PT 13". There are no readouts pertaining to wires 14, 15 and 16 because sensor unit 22 does not detect any current flowing through these wires.
(2) Red indicator light 30 is off because sensor unit 22 does not detect any current flowing through wires other than wire 13B. Microprocessor 20 knows wire 13 is being tested and that wire 13B should be transmitting current.
(3) Green indicator light 31 is on because internal power source 23 circuitry indicates 36 to microprocessor 20 that power source 23 is in the proper operative condition and is delivering a small three to ten ma current to switching unit 21.
(4) Amber indicator light 32 is off because there is no built-in jumper connection in cannon plug 17 between wire 13 and one of the other wires.
(5) The Full Load Test button 24 is in "OFF" position because a full load test is not being performed.

b. Readings on detector unit (DU) 200:
(1) LED readout 57 reads, in sequence: There is no readout. There are no readouts because sensor unit 52 does not detect any current flowing through wires 13C-16C.
(2) Red indicator light 61 is off because there is no current flow detected by sensor unit 52 over wires 14C-16C.
(3) Amber indicator light 63 is off because there is no current flow detected by sensor unit 52 over wire 13C.
(4) Green indicator light 62 is off because a full load test is not being performed.

(5) The Full Load Test button is in the "OFF" position because a full load test is not being performed.

RESULT: Based on the readouts on CU 100 and DU 200 following Steps 1-3 above, the technician knows that the CU 100 wire to which he touched the DU 200 wire is not wire 13.

SUBSEQUENT MAINTENANCE PROCEDURE: Touch the DU wire to different CU wires until CU wire 13 is located.

Step 4

The technician continues to hold onto the wire (wire 14) extending from the DU 200 and touches it to a different wire (wire 13) extending from the CU 100. The technician does not know the true identity of either wire when he initially touches them together. After the wires are touched together, the small current directed into wire 13 by CU 100 travels along wire 13 extending from CU 100, into wire 14 extending from DU 200, through connectors 18A and 59, and into sensor unit 52. Signal 66 from sensor unit 52 to DU microprocessor 50 indicates that a small current is flowing through line 14C and that no current is flowing through lines 13C, 15C and 16C. Sensor unit 22 of CU 100 informs 40 microprocessor 20 that a small current is flowing through line 13A and that no current is flowing through lines 14A-16A. After receiving the afore-mentioned data, microprocessors 20 and 50 direct 35, 65 LED readouts 27 and 57, respectively, and direct 33, 68 display lights 25, 55 to read as indicated below.

a. Readings on control unit (CU) 100:
(1) LED readout 27 reads, in sequence: "PT 13". There are no readouts pertaining to wires 14-16 because sensor unit 22 does not detect any current flowing through these wires.
(2) Red indicator light 30 is off because there is no current flow detected by sensor unit 22 over wires –14B-16B.
(3) Green indicator light 31 is on because internal power source 23 circuitry indicates 36 to microprocessor 20 that power source 23 is in proper operative condition.
(4) Amber indicator light 32 is off because there is no built-in jumper connection in cannon plug 17 between wire 13 and one of the other wires.
(5) The Full Load Test button 24 is in the "OFF" position because a full load test is not being performed.

b. Readings on detector unit (DU) 200:
(1) LED readout 57 reads, in sequence: "SS 14". There are no other readouts because sensor unit 52 does not detect any current flowing through wires 13C, 15C and 16C.
(2) Red indicator light 61 is on because of the current flow detected by sensor unit 52 over wire 14C.
(3) Amber indicator light 63 is off because there is no current flow detected by sensor unit 52 over wire 13C.
(4) Green indicator light 62 is off because a full load test is not being performed.
(5) The Full Load Test button 54 is in the "OFF" position because a full load test is not being performed.

RESULT: Based on the readouts on CU 100 and DU 200 following Step 4 above, the technician knows that the CU wire he has touched is wire 13 and knows that the DU wire touching CU wire 13 is wire 14.

SUBSEQUENT MAINTENANCE PROCEDURE: The technician marks wire 13 extending from the control unit 100, and marks wire 14 extending from the detector unit 200.

Step 5

Buttons "1" and "4" are sequentially pushed both on keyboard 26 and keyboard 56, and wire 14 extending from DU 200 is touched to the remaining unidentified wires extending from CU 100 until the reading "SP 14" appears on LED readout 57. When "SP 14" appears on readout 57, then wire 14 extending from DU 200 has been touched to wire 14 extending from CU 100. The technician marks wire 14 extending from CU 100.

Step 6

Buttons "1" and "5" are sequentially pushed both on keyboard 26 and keyboard 56 and wire 14 extending from DU 200 is touched to the remaining unidentified wires extending from CU 100 until the reading "SS 14" appears on readout 57. When "SS 14" appears on readout 57, then wire 14 extending from DU 200 has been touched to wire 15 extending from CU 100. The technician marks wire 15 extending from the CU 100, and, also marks the remaining wire extending from CU 100 as wire 16.

Step 7

Wire 15 from CU 100 is touched to each of the remaining unidentified wires extending from DU 200 to identify these wires. As would be appreciated by those of skill in the art from the foregoing descriptions herein, each time wire 15 is touched to one of the remaining unidentified wires extending from DU 200, one of the following readings will appear on LED readout 57: "SP 15", "SS 14" or "SS 16". Each of the remaining wires extending from DU 200 is marked when it is identified.

Step 8

Wire 14 extending from CU 100 is attached to wire 14 extending from DU 200; wire 15 extending from CU 100 is attached to wire 15 extending from DU 200; wire 16 extending from CU 100 is attached to wire 16 extending from DU 200; and, wire 13 extending from CU 100 is attached to wire 13 extending from DU 200. After the wires are attached, each wire is given a full load test to insure the wires have the desired conductive continuity.

CU 100 and DU 200 can be constructed from existing off-the-shelf electronic components and can, depending on the size of a cannon plug 17, 18, often be sized to be carried in the pocket of an individual. It is anticipated that each CU 100—DU 200 pair will be constructed for testing a cable which is built to carry a certain current and voltage and has cannon plugs or other connector means of a particular shape and dimension. The connectors 28, 59 on the CU and DU would be constructed to readily mate with the cable cannon plugs or other connector means to provide cable—CU and cable—DU interfaces having the proper conductive continuity. Structure and other information peculiar to a cable, for instance the existence of built-in jumpers between wires, would be programmed into the microprocessors provided in CU 100 and DU 200.

While the transmission lines used to transmit electromagnetic radiation are, in the drawings and in TABLES I-III, described as electrically conductive wires, the lines can be constructed as appropriate to carry other types of energy. For example, transmission line 12 can be a fiber optic cable for conducting light or can be a hollow tube for conducting heat or radio waves.

Figure 5:
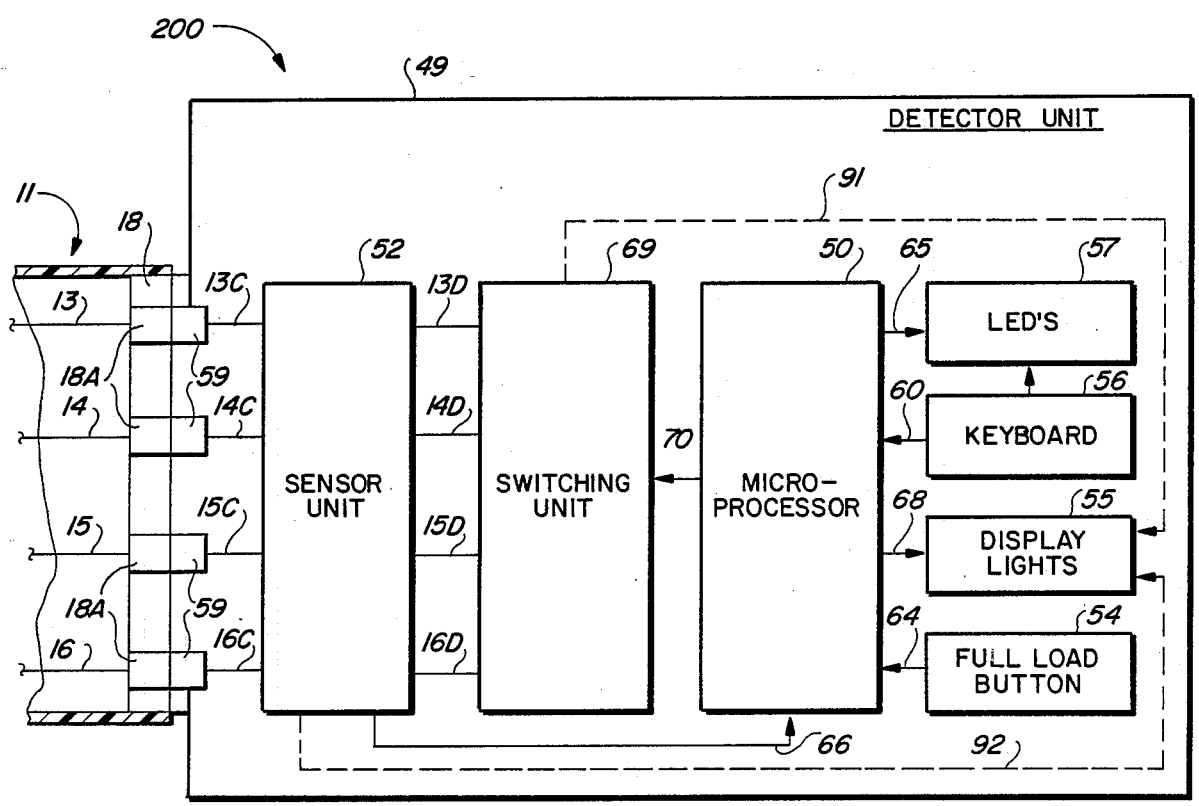

CU 100 and DU 200 need not include microprocessors in order to function in accordance with the invention. CU 100 can comprise a mechanical switch which can connect a line or wire being tested to a battery or other power source. DU 200 can comprise a mechanical switch which can connect the line or wire being tested with an appropriate load and an indicator light(s). The DU would include means for individually checking or simultaneously monitoring each wire or line in a cable to determine if current is present in the lines when a signal is sent by the CU over the line being tested. For example, in FIG. 4 microprocessor 20, LED readout 27, and keyboard 26 can be eliminated. Switching unit 21 can include a mechanical switch which, when rotated to the wire 13-16 being tested, permits current from power source 23 to only flow over the wire being tested. Sensor unit 22 can include a switch which causes current on any wire other than the wire being tested to flow 90 to and illuminate stray signal indicator 30. In place of or in addition to indicator 30 there can be an indicator light connected to each wire 13-16 so that the particular wire carrying the stray signal can be identified. The indicator light for each wire would illuminate when current passed through the wire. In FIG. 5, microprocessor 50, LED readout 57, and keyboard 56 can be eliminated. Switching unit 69 can include a mechanical switch which, when rotated to the wire being tested, permits current flowing through the wire being tested to flow 91 to and illuminate amber continuity indicator 63. Sensor unit 52 can include a mechanical switch which causes current on any wire other than the wire being tested to flow 92 to stray signal indicator 61. In place of or in addition to indicator 61 there can be an indicator light connected to each wire 13-16 so that the particular wire carrying the stray signal can be identified. The indicator light for each wire would illuminate when current flowed through the wire.

A particular advantage of the apparatus of the invention is that the CU 100 and DU 200 are normally not physically or structurally interconnected and, accordingly, are independent of one another. While means can be provided for physically or structurally interconnecting the CU and DU microprocessors with a transmission wire, cable, etc., this is not necessary in the use of the invention, particularly since the apparatus of the invention is intended for use by a pair of teenaged servicemen having minimal training in the fundamentals of electricity.

If desired, means can be provided for transmitting from the CU microprocessor to the DU microprocessor either the identity of the wire being tested on the CU or other information.

In aircraft and other electro-mechanical systems, intermittent electrical failures often constitute 30% to 70% of all faults or system failures which occur during operation of the aircraft. In some harness intensive aircraft systems, up to 90% of these intermittent electrical failures result from faulty electrical contacts and connects, or from faulty wire splices, crimps, solder connections, etc. Unfortunately, before an aircraft "harness", i.e. a cable comprised of plurality of wires, fails sufficiently to be detected through conventional fault isolation procedures, line replaceable units (LRU's) or "black boxes" are removed and checked at local intermediate or offsite depot facilities, incurring substantial maintenance expense.

During an intermittent electrical failure, the flow of electricity to an LRU or other electrically powered component is attenuated an amount sufficient to cause the LRU to be inoperative or to not operate properly. Intermittent electrical failures result when the resistance of a wire is temporarily increased as described below.

An intermittent failure typically occurs when, during operation of an aircraft, the aircraft is turning, descending or climbing and is subjected to vibrational and other forces different than those encountered in level flight or while the aircraft is resting on the ground. These forces produced during the turning, descent, or ascent of an aircraft move and stress harnesses in the aircraft and can cause slippage in crimp connections, cracked solder connections, etc. to separate or loosen the conductor sufficiently from the terminating hardware to substantially increase the electrical resistance of a wire in a harness, and, consequently, to prevent proper operation of the LRU or other electrically powered operational component which processes signals and is powered with electricity delivered by the harness to the LRU. Means are provided on the aircraft for detecting the failure of an LRU. Such means include cockpit warning lights which indicate the LRU is not functioning properly or that the LRU is not sufficiently powered. Such means also include visual inspection by the pilot when, for example, the pilot can see that a wing flap is not moving. Once an aircraft resumes level flight or lands, intermittent electrical faults often "disappear" and the LRU begins to operate properly because the harness is providing sufficient electricity to the LRU—this is why such electrical failures are termed intermittent. When the pilot reports the intermittent failure, a maintenance technician removes the LRU powered by the harness and sends the LRU to a maintenance depot for testing. The depot determines there is nothing wrong with the LRU and returns it. The LRU is reinstalled and, often times, the technician assumes this constitutes "repair" of the intermittent fault and then takes no further steps to identify the fault. As evidenced below, even if the technician utilized conventional field or flight line testing procedures, the cause of the intermittent fault often would not be identified. Consequently, conventional fault isolation procedures waste many maintenance man-hours in the repeated ineffective troubleshooting of aircraft malfunctions.

The method and apparatus of the invention enable the accurate identification of the cause of an intermittent electrical failure and greatly reduce, by as much as 25% to 50%, the number of instances when an LRU or other electrically powered component must be removed from an aircraft and returned to depot for testing.

The reliability of continuity tests are further compromised by the fact that a technician attempting to determine why a problem occurred in the wiring of an aircraft during flight is normally attempting to do so while the aircraft is on the ground in a non-operational rest state. The conditions the aircraft is subjected to while immobilized on the ground are, of course, different than those experienced by the aircraft while in flight. However, the equipment developed for conventional troubleshooting procedures can basically only be utilized while the aircraft is at rest on the ground, and then with only limited success. In particular, technicians attempting to move or "shake down" a harness during a continuity test often find that the 16 gage probes on the test leads break contact with the pins in the cannon plug of the harness. Various devices have been developed in an attempt to insure a continuous contact between a test lead and cannon plug pin. These devices include alligator clips, safety wire, and wire wrap techniques. Such devices have not proven very effective at maintaining contact between a test lead and cannon plug when a harness is being moved or shaken by a technician. Improper contact between a test lead and a cannon plug lead produces spurious data which prevents the accurate identification of faults in a cable. Measurements made with conventional troubleshooting equipment are further compromised by multimeter tolerances, usually in the range of plus or minus three percent, and by batteries which weaken and do not provide sufficient power. Technicians often mistakenly believe that weak batteries are "worked around" by switching from R×1 to R×10 scale factors on the multimeter. The foregoing limitations of conventional troubleshooting equipment totally prevent the precise milliohm measurements necessary to accurately troubleshoot harness faults.

Conventional wire fault isolation procedures, in addition to requiring a continuity test, may also specify an unloaded power test. During an unloaded power test, power—typically 24 volts DC or 115 volts AC—is directed to a connector contact in a harness, across a 20K ohm resistor inside the test meter and to the vehicle structure or to ground. The unloaded power test can result in inadvertent arcing conditions when an aircraft harness is being moved or shaken to reveal faults in the cable wiring. Such arcing occurs all too frequently because technicians get excited when testing "hot" circuits. Further, the test lead probe often slips and simultaneously makes contact with the "hot" pin and the connector case or other connector pins, resulting in the condition known as "meltdown".

Another conventional wire fault detection procedure is a short circuit test of a wire to ground, usually required when a circuit breaker has been tripped during operation of the aircraft.

The "check for continuity", "check for voltage", and "check for shorts to ground" directives discussed above represent the sum of all wire diagnostic guidance normally available to aircraft maintenance personnel in the field.

In developing the apparatus and method of the invention, I analyzed the maintenance records for various types of aircraft and determined that the primary causes of electrical malfunctions in aircraft harnesses were series resistance faults and short circuit faults. Open or completely severed wires were only rarely the cause of harness malfunctions. Examples of series resistance problems are defective solder connections or wire splices which cause wires to be only loosely attached to other wires, pins or connectors. These loose connections increase to unacceptable levels the resistance of a wire to the passage of electricity. Such series resistances normally exist even in a sound aircraft harness at the points at which wires are securely and properly connected to other wires or electrical contacts. However, when wires are properly connected such "series resistances" are relatively minor and fall within acceptable operational parameters of the harness. When wire connections become loose, then the series resistance values associated with a harness greatly increase. Most aircraft harness problems, whether series resistance faults, short circuit faults, or open or completely severed wires, are initially revealed during flight in the form of intermittent functioning of the system containing the harness.

In the method of the invention, the following measurements are preferably made on the same harnesses in at least two identical aircraft or aircraft systems, or the measurements are made on two identical harnesses in the same aircraft or aircraft system. Identical harnesses have wires of the same length, gage, and material; have the same number of bulkheads, splices, etc.; and have the same cannon plugs or electrical connectors at either end of the harness. The hardware used to securely fasten test equipment to one harness is also used to fasten test equipment to the other harnesses. The measurements which are obtained are utilized to develop, in the manner described below, a history and data base for a harness. The data base is useful, and necessary, in analyzing harness or system malfunctions in the aircraft or in identical harnesses or similar systems in other aircraft. The measurements include:

1. A continuity test to identify harness wires which have been severed or have broken away from crimp, solder or other types of connections. The continuity test is performed on each wire in a harness in the manner indicated in the diagram of FIG. 6 for the harness 71 interconnecting components P405R and P404R. The readings obtained during the continuity test are accurate to within plus or minus five milliohms, preferably to within plus or minus one milliohm. These tolerances are important in permitting wiring faults to be accurately identified.

2. A stray voltage test of a harness to identify short circuits from a wire in a harness to another wire in the harness or to another structural component of the aircraft. The stray voltage test is performed between a selected wire and every other conductor in an aircraft harness. For example, if a harness has four wires, current is directed into one end of the harness into one wire and both ends of the remaining three wires are monitored to determine if current is flowing through the remaining three wires. When the apparatus of the invention illustrated in FIGS. 1 to 3 is utilized as described in Tables I to III herein, the continuity and stray voltage test are, in essence, performed simultaneously. For example, in Step 2 in Table I the technician determines both that wires 13 and 14 are not severed and that wire 13 is shorted to wire 14. The stray voltage test can also be performed in the manner indicated in the diagram of FIG. 7. While not shown in FIG. 7, the ends of harnesses 71-80 would be disconnected from components P404R, P3R, P4R, P605, P606, P607, P425, P422R, P317 and P401R, respectively, prior to and during performance of the stray voltage test as well as during the continuity and voltage drop tests. The ends of harnesses at component P405R merge in one single large cannon plug attached to P405R. This large cannon plug is also disconnected during the stray voltage test, as well as during the continuity and voltage drop tests. A current is then directed down each wire in harnesses 71-80. When a current is directed down a wire, the remaining wires in harnesses 71-80 are monitored to determine if there are any stray voltages on said remaining wires.

3. A voltage drop or "full load" test to evaluate the series resistance in each wire in a harness. Splices, poor crimps, cold solder connections, pin retention, defective locks on crimp pin connectors and connectors that are not properly mated all increase the series resistance in a wire. The voltage drop test is performed on each wire in a harness in the manner indicated in the diagram of FIG. 8 for the wire interconnecting components P405R and P404R. The apparatus of the invention illustrated in FIGS. 1 to 3 can also be utilized to perform a full load test in the manner described in Table I, steps 5 to 8.

The data obtained during the above measurements is utilized to prepare a data base indicating acceptable value ranges for measurements made on a wire in a harness during a continuity test or a voltage drop test. Such value ranges, or acceptable deviations from a desired or normal value, are, in utilizing the method of the invention, invaluable in facilitating the rapid identification of wire faults.

Figure 6:
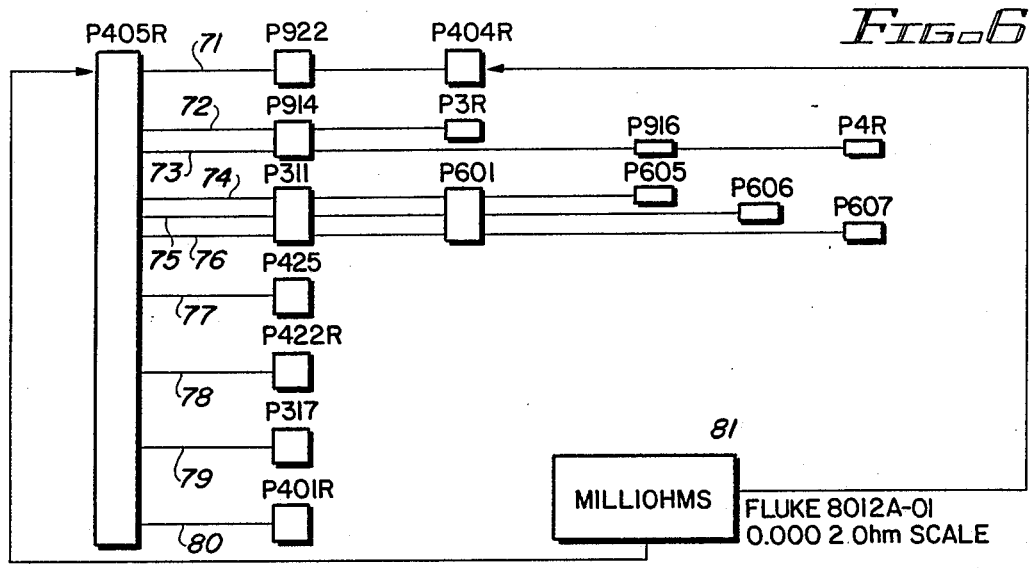
FIG. 6, shows in schematic form a basic wiring component diagram of a UH60A Stabilator Interface #1 Sub-System and illustrates the manner in which a continuity test is performed on each wire in a wiring harness.
Figure 7:
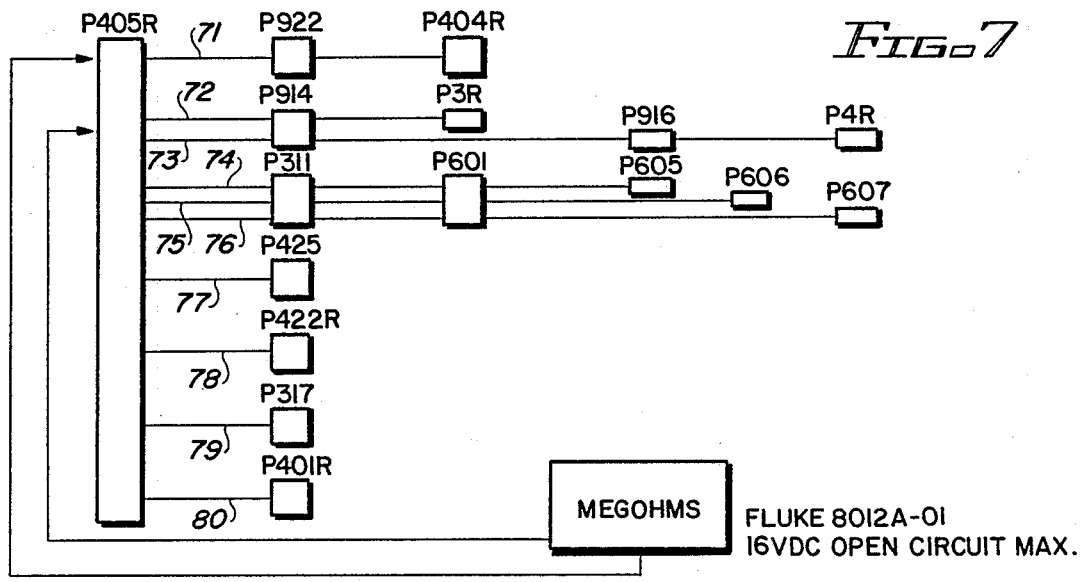
FIG. 7 shows in schematic form a basic wiring component diagram of a UH60A Stabilator Interface #1 Sub-System and illustrates the manner in which a stray voltage test can be performed on each wire in a wiring harness.
Figure 8:
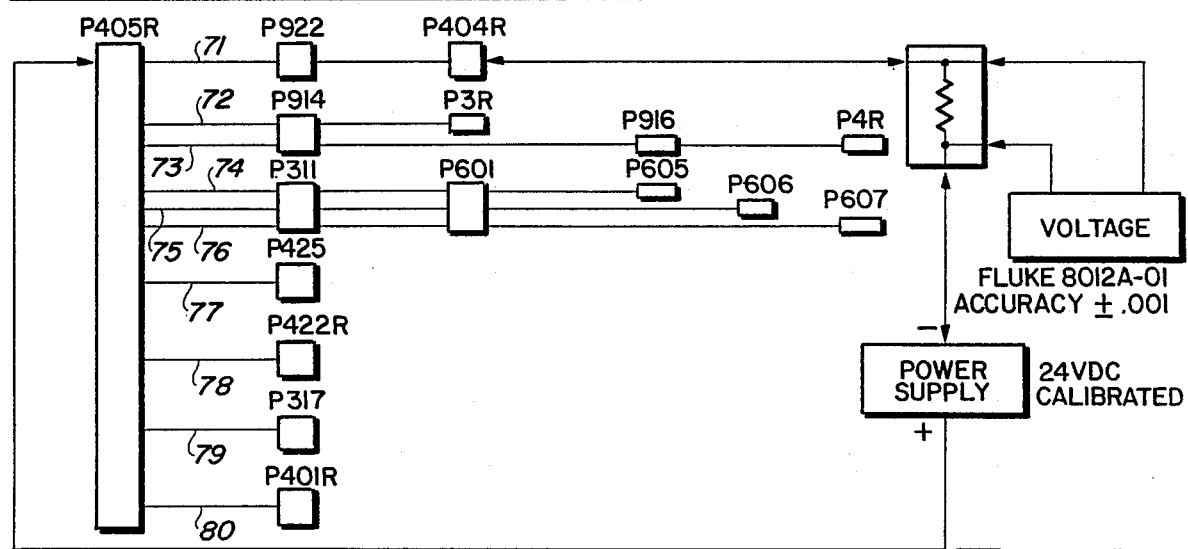
FIG. 8 shows in schematic form a basic wiring component diagram of a UH60A Stabilator Interface #1 Sub-System and illustrates the manner in which a voltage drop test is performed on each wire in a wiring harness.

The basic wiring—component diagram included in FIGS. 6–8 is of the UH60A Flight Control Stabilator Interface. The various components in the wiring—component diagram are noted below in Table IV.

TABLE IV

UH60A Stabilator Interface #1 Connector List

TABLE IV

UH60A Stabilator Interface #1 Connector List

| Component Description | Component Part Number | Component Location |
|---|---|---|
| No. 1 Stabilator Amplifier | P405R | Aft Cargo Bay/Top R/H |
| No. 2 Stabilator Amplifier | P404R | Aft Cargo Bay/Top L/H |
| No. 1 Lateral Accelerometer | P425R | Nose Compartment |
| No. 1 Collective Stick Position Sensor | J317 | Center/Top Fuselage |
| Stabilator Controls/Auto Flight Control Panel | P3R | Lower Console |
| Stabilator Controls/Auto Flight Control Panel | P4R | Lower Console |
| Airspeed Transducer | P401R | Nose Compartment |
| SAS/FPS Computer | P422R | Lower Console |
| Stab. Pos. Switch/Transmitter | P605 | Tail Cone |
| No. 2 Stabilator Actuator Upper | P606 | Tail Cone |
| No. 1 Stabilator Actuator Lower | P607 | Tail Cone |
| Bulkhead | P311 | Cabin Ceiling BH 17 LH STA 387 Between P405R and P605, 6, 7 |
| Bulkhead | P601 | Tail Cone BH 2 RH STA 650 Between P405R and P605, 6, 7 |
| Bulkhead | P916 | Cabin Tub R/H Between Stab./ Auto Cont. Panel P4R and P405 |
| Bulkhead | P922 | Cabin Ceiling BL 110.7 STA 380 LH Between Stab. AMP #2 P404R and P405R |
| Bulkhead | P914 | Cockpit BH 24 STA 247 LH Between Stab./ Auto Cont. Panel P3R and P4R and P405R |

In FIGS. 6 to 8, harness 71 interconnects components P405R and P404R; harness 72 interconnects components P405R and P3R; harness 73 interconnects components P405R and P4R; harness 74 interconnects components P405R and P605; harness 75 interconnects components P405R and P606; harness 76 interconnects components P405R and P607; harness 77 interconnects components P405R and P425; harness 78 interconnects components P405R and P422R; harness 79 interconnects components P405R, and P317; and, harness 80 interconnects components P405R and P401R.

Continuity test measurements and voltage drop test measurements made on a UH60A stabilator interface #1 of the type illustrated in FIGS. 6–8 are summarized below in Table V. During continuity and voltage drop tests, the ends of each harness are disconnected from the end or destination components of the harness and are also disconnected from component P405R. Note that in the system illustrated in FIGS. 6 to 8, all harnesses merge in a single cannon plug which is connected to component P405R. By way of example, when a continuity test is performed on harness 71, the cannon plug attaching harness 71 to end or destination component P404R is disconnected from component P404R, and the cannon plug attaching harnesses 71–80 to component P405R is disconnected from P405R. Test lead connections are made to pins in both of the cannon plugs which have been disconnected from components P405R and P404R and are on either end of harness 71.

TABLE V

Continuity and Voltage Drop Test Results for Aircraft Type UH60A Flight Control Stabilator #1 Sub-System

TABLE V

Continuity and Voltage Drop Test Results for Aircraft Type UH60A Flight Control Stabilator #1 Sub-System

| Harness | Wire tested From pin[1] | Wire tested to pin[2] | End Component | Wire Gage | Continuity Test: low power resistence measured, $R_H$ | Voltage Drop Test: voltage drop measured $VD_{1b}$ | calculated voltage drop $VD_C$ |
|---|---|---|---|---|---|---|---|
| N/A[3] | AA | J | P405R | 22 | .001 | | |
| N/A[3] | a | e | P405R | 22 | .001 | | |
| 71 | A | C | P404R | 22 | .056 | 23.1 | .4 |
| 71 | C | A | P404R | 22 | .056 | 23.1 | .4 |
| 71 | GG | BB | P404R | 22 | .056 | 23.1 | .4 |
| 71 | B | V | P404R | 22 | .078 | 23.0 | .5 |
| 71 | V | B | P404R | 22 | .076 | 23.0 | .5 |

TABLE V-continued
Continuity and Voltage Drop Test Results for Aircraft Type UH60A Flight Control Stabilator #1 Sub-System

| Harness | Wire tested From pin[1] | Wire tested to pin[2] | End Component | Wire Gage | Continuity Test: low power resistence measured, $R_H$ | Voltage Drop Test: voltage drop measured $VD_{1b}$ | calculated voltage drop $VD_C$ |
|---|---|---|---|---|---|---|---|
| 71 | EE | v | P404R | 22 | .080 | 23.0 | .5 |
| 71 | v | EE | P404R | 22 | .081 | 23.0 | .5 |
| 71 | c | z | P404R | 22 | .135 | 23.0 | .5 |
| 71 | z | c | P404R | 22 | .594 | 22.8 | .7 |
| 77 | K | G | P425R | 22 | .294 | 22.9 | .6 |
| 77 | r | A | P425R | 22 | .386 | 22.8 | .7 |
| 78 | BB | 8 | P317 | 22 | .371 | 22.2 | 1.3 |
| 78 | d | 5 | P317 | 22 | .573 | 22.8 | .7 |
| 72 | CC | G | J3R | 18 | .456 | 22.1 | 1.4 |
| 72 | v | N | J3R | 18 | .493 | 22.0 | 1.5 |
| 72 | q | K | J3R | 18 | .771 | 21.9 | 1.6 |
| 72 | HH | F | J3R | 18 | .772 | 21.9 | 1.6 |
| 72 | p | d | J3R | 18 | .774 | 21.9 | 1.6 |
| 72 | W | e | J3R | 18 | .774 | 21.9 | 1.6 |
| 73 | B | L | P4R | 18 | .513 | 22.1 | 1.4 |
| 73 | FF | R | P4R | 18 | .777 | 21.9 | 1.6 |
| 76 | Y | J | J607 | 20 | .522 | 22.8 | .7 |
| 76 | D | J | J607 | 20 | .524 | 22.8 | .7 |
| 76 | E | K | J607 | 20 | .526 | 22.8 | .7 |
| 76 | F | K | J607 | 20 | .526 | 22.8 | .7 |
| 76 | s | G | J607 | 22 | .558 | 22.8 | .7 |
| 76 | t | E | J607 | 22 | .559 | 22.8 | .7 |
| 76 | r | A | J607 | 22 | 1.449 | 22.4 | 1.1 |
| 76 | z | C | J607 | 22 | 1.459 | 22.4 | 1.1 |
| 74 | t | B | J605 | 22 | .523 | 22.8 | .7 |
| 74 | s | D | J605 | 22 | .523 | 22.8 | .7 |
| 80 | r | A | P401R | 22 | .689 | 22.7 | .8 |
| 80 | w | D | P401R | 22 | .690 | 22.0 | 1.5 |
| 77 | d | w | P422R | 22 | .835 | 22.7 | .8 |
| 77 | H | M | P422R | 22 | .844 | 22.0 | 1.3 |
| 77 | L | CC | P422R | 22 | .963 | 22.0 | 1.3 |
| 75 | c | C | P606 | 22 | 1.019 | 22.6 | .9 |

[1] Pin in cannon plug attaching harness to component P405R.
[2] Pin in cannon plug attaching harness to end component.
[3] Pins AA, J, a, e in P405R cannon plug.

In Table V, the continuity test was performed by directing a 20 ma (milliamp) current through each wire. The voltage drop test was performed with each wire carrying 24 volts and 500 ma. The voltage drop $VD_c$ noted in Table V for each wire was calculated in accordance with the following example for the wire leading from pin A in the cannon plug on the P405R of harness 71 to pin C in the cannon plug on the other end of harness 71.

$VD_c$=Voltage drop, across conductor (calculated)
$V_s$=Voltage source (calibrated) 24 VDC (VDC=direct current voltage)
$VD_{ts}$=Voltage drop of test set (measured) 0.5 VD
$VD_{1b}$=Voltage drop, across load bank (measured) 23.1 VDC based on the wire in harness 71 extending from pin A on the P405R end of harness 71 to pin C on the P404R end of harness 71. See Table V.

The relationship of these values is expressed below:

$$VD_c = V_s - (VD_{ts} + VD_{1b})$$

$$VD_c = 24\ VDC - (0.5 + 23.1) VDC$$

$$VD_c = 24 - 23.6$$

$$VD_2 = 0.4\ VDC$$

The data in Table V identifies likely problem areas. For instance, in harness 71 each wire between components P405R and P404R is of the same diameter and length and is connected to the same termination hardware, yet the wire (hereafter called the "A wire") extending from pin A on the P405R end of harness 71 to pin C on the P404R end of the harness has a continuity test resistance of only 56 milliohms while the wire (hereafter called the "Z wire") extending from pin Z on the P405R end of harness 71 to pin C on the P404R end of the harness has a continuity test resistance of 594 milliohms. Therefore, the continuity test resistance of the A wire is 1000% less than that of the Z wire. The voltage drop test results for the A wire and the Z wire do not, however, reflect the same relationship. The Z wire voltage drop of 700 MV is only 300 MV, or 200%, greater than that of the A wire. One plausible explanation for the discrepancy between the A wire and the Z wire is that the Z wire has been spliced and is "piggybacked" along the outside of harness 71. In other words, the Z wire is functional. A more worrisome possibility is that the Z wire is suffering from "series sickness", i.e., pin retention problems, cold solder joints, miscrimps or mechanically failed crimps of a contacts, or broken or corroded wire strands. Other causes of unusually high resistance through a wire are defective locks on crimp pin connectors, mechanically defective splices, and contact surface scoring caused by the use of safety wire to interface female contacts or caused by the use of alligator clips on male contacts.

Another discrepancy disclosed in Table V concerns the wires (hereafter called the "BB wire" and the "d wire") in harness 78 leading from pins BB and d in the cannon plug at the P405R end of harness 78 to pins 8 and 5 in the cannon plug at the P317 end of harness 78. There is only about 200 milliohms difference (573 milliohms vs 371 milliohms) in the resistance of the BB wire and d wire during the continuity test, but the calculated voltage drop achieved during the voltage drop test for the BB wire is 600 MV greater than the calculated voltage drop for the d wire. This large 600 MV voltage drop differential between the BB wire and the d wire is an indication of "series sickness" in the BB wire.

There are several more anomalies in Table V. The wires (hereinafter called the "r wire" and the "w wire") in harness 80 leading from pins r and w in the cannon plug at the P405R end of harness 80 to the A and D pins, respectively, in the cannon plug at the P401R end of harness 80 have continuity test resistance values (690 vs. 689 milliohms) which are only one milliohm apart. In contrast, the voltage drop test values $VD_c$ (800 vs 1500 MV) are 700 MV apart. This is, again, an indication of series sickness in the r wire. The wires (hereafter called the "Y wire" and the "r76 wire") in harness 76 leading from the Y and r76 pins at the P405R end of harness 76 to the J and A pins in the cannon plug at the J607 end of harness 76 have continuity test resistance values (522 vs 1449 milliohms) which vary greatly. The cause of the difference in the continuity test resistance values for the Y wire and the r76 wire is not determinable from Table V. With the results of physical examination of harnesses 71 to 80 to determine the cause for faults therein and with measurements made for identical harnesses 71 to 80 is similar aircraft or aircraft systems, a table of nominal values or acceptable ranges of continuity test resistance values and of voltage drop test values is developed to facilitate the periodic maintenance and troubleshooting of harnesses 71 to 80.

The below Table VI was developed solely from the data presented in Table V.

TABLE VI

Acceptable Continuity Test and Voltage Drop Test Results for Harnesses 71–80 in the UH60A Flight Control Stabilator #1, Sub-System

TABLE VI

| Harness | Acceptable Continuity Test Results: measured resistance at 20 ma current must be less than (ohms): | Acceptable Voltage Drop Test Result: calculated voltage drop $VD_c$ at 24 volts - 500 ma must be less than (volts): |
|---|---|---|
| 71 | 0.135 | 0.6 |
| 77 | 0.39 | 0.7 |
| 78 | 0.60 | 0.8 |
| 72 | 0.80 | 1.6 |
| 73 | 0.80 | 1.6 |
| 76 | 0.60 | 0.8 |
| 74 | 0.55 | 0.75 |
| 80 | 0.70 | 0.80 |
| 77 | 1.00 | 0.80 |
| 75 | 1.10 | 1.00 |

It is understood that the values developed for a table like Table V or Table VI are probably more accurate and useful when measurements have been made on a plurality of harnesses 71, harnesses 72, harnesses 73 etc. in a group of like aircraft and when the cause for any discrepancies in continuity test results and voltage drop test results is ascertained. When a harness is sound and has not been damaged the expected measurements $R_H$, $VD_{16}$, and $VD_C$, can be calculated. However, it may be that splices, and consequently greater resistance values, in certain wires in a harness are acceptable and that greater continuity evaluation-reference measurements are acceptable and are incorporated in a troubleshooting reference information table like Table VI. The continuity evaluation-reference measurement information and load evaluation-reference measurement information compiled in a table like Table VI is based on the expected theoretical optimum performance of the harness (consisting of one or more wires) under ideal conditions (i.e., when each wire in the harness is continuous and not damaged and when all wire-to-connector crimps, solders, etc. are properly made; and, when the cable is operating in air at a prescribed temperature) and, in large part, is based on the continuity evaluation-reference measurements and load evaluation-reference measurements made on harnesses when they are sound and are in operational aircraft. The optimum performance of a harness when the harness is stretched out on a laboratory table is usually greater that the performance which can be expected when the harness is covered with an insulative material and is clamped into and winds through the infrastructure of an aircraft. The purpose of a table like Table V or Table VI is to provide reference information which will, when compared with similar measurements made on a like aircraft harness, provide a means for indicating when the harness is sound or has faults which prevent the harness from operating according to designated specifications concerning the electrical resistance and current carrying capacity of the harness.

For aircraft maintenance to be performed in accordance with the method and apparatus of the invention, accurate continuity tests, stray voltage tests, and voltage drop tests must be performed for each wire in a harness, and, based on such data, on similar data for identical harnesses, and on physical examination of the tested harness to determine the cause for discrepancies in such data, a troubleshooting data base of continuity evaluation-reference measurements and load evaluation-reference measurements of the type shown in Table VI is prepared. As would be appreciated by those of skill in the art, the testing apparatus of FIGS. 1 to 3 makes such a maintenance approach practicable and extremely useful. Making continuity tests, stray voltage tests, and voltage drop tests for each wire in a harness is important because of differences in the heat dissipation characteristics of the wires. The heat dissipation ability of a particular gauge wire can vary greatly depending on the location of the wire, i.e., depending on whether the wire is coated with insulation, is located inside a cable (harness), is located at the periphery of a cable, etc. The aircraft maintenance method and apparatus of the invention are apparently not disclosed in field or flight line maintenance manuals provided repair technicians. Technicians instead rely on conventional testing procedures described earlier, and as a result, incur substantial time and expense in attempting to isolate electrical faults, in particular intermittent faults, in an aircraft system.

As utilized herein, the terms "continuity test" or "continuity evaluation" refer to a test to determine if a wire has been completely severed. The test is performed by directing current into one end of a wire and determining the amount of current reaching the other end of the wire. If no current reaches the other end, the wire is considered to be severed and is discarded or physically inspected to determine the location of the fault. Minimal amounts of current, typically three to thirty milliamps (depending on the size of wire being tested) are used in performing continuity tests. Currents in excess of thirty milliamps can be utilized.

As used herein, the terms "load test" or "load evaluation" refer to a test to determine whether a wire will perform as expected under normal use or normal load conditions, where the term "load" refers to the quantity of current carried to the wire. If desired, a load test may also be utilized to determine if a wire will work at its maximum rate, i.e., at its maximum rated current when the wire is in free air at a particular ambient temperature. A single strand of a 22 gauge stranded wire could, for example, be expected to carry a maximum of seven and a half amps at 70° F. in free air. When the wire strand is coated with insulation and placed in an aircraft, the load capacity of each strand of the wire is less. Each strand might, instead of seven and a half amps, only be able, to carry a load of three amps when the strand was sound (i.e., had no splices, loose splices, crimps, loose crimps, etc.). In many military specifications, splices are not permitted in a length of wire, accordingly, a sound wire cannot, by definition, be spliced. In other applications a spliced or crimped wire is acceptable and is termed sound if the splice is properly and securely made.

Load tests ordinarily, but not necessarily, utilize significantly greater amounts of current than do continuity tests. A load test will often more readily identify splices, loose connections, etc. than will a continuity test. In order to load test stranded aircraft wire having a size in the range of twelve to thirty gauge, currents in the range of 0.5 to 15 amps are ordinarily utilized.

In Table VI the "Acceptance Continuity Test Results" values represent continuity evaluation-reference measurement information compiled from values $R_H$ in Table V. In Table VI, the "Acceptable Voltage Test Result" values represent load evaluation-reference measurement information compiled from values $VD_C$ in Table V.

After the continuity evaluation-reference measurement and load evaluation-reference measurement information Table(s) V and/or VI are developed, the integrity of a harness 71–78, 80 in a UH60A aircraft is evaluated by performing a continuity test and a load test utilizing the same general procedures utilized to develop the data in Table V: the measurements made on the harness are termed continuity evaluation-fault detection information and load evaluation-fault detection information and are compared with the data of Tables V and/or VI to generate continuity fault-identification information and load fault-identification information. By way of example, if measurements on a wire in harness 78 in UH60A aircraft produced an $R_H$ equal to 0.50 amps, and produced a $VD_C$ of 0.9 volts, the $R_H$ value would comprise continuity evaluation-fault detection information and the $VD_C$ value of 0.9 volts would comprise load evaluation-fault detection information. The fault detection information values would be compared to the values in Table VI (or Table V) to generate fault-identification information. Since the $R_H$ of 0.50 amps is less than the maximum value of 0.60 indicated by Table VI, the fault identification information would indicate the wire being tested in harness 78 was sound. Since the $VD_C$ value of 0.9 volts is greater than the maximum of 0.8 volts mandated by Table VI, the fault identification information generated would indicate the wire did not meet required operational specifications and that harness 78 needed to be discarded or to be further tested to determine why the $VD_C$ value was above normal. The continuity or load fault identification information generated to designate whether a wire meets required operational specifications could simply comprise an illuminated light (such as light 62 in FIG. 1 when the full load test is being performed as described in Table I herein), could comprise the read out "WIRE SOUND" or "WIRE FAULT" on an LED similar to readout 57 in FIG. 1, could comprise a maintenance man's visual comparison of the reference information and fault detection information to determine whether the fault detection information was within or varied from the parameters defined by the reference information, etc.

The continuity evaluation-reference measurement information and load evaluation-reference measurement information can be recorded or stored in any suitable prior art memory unit such as electromagnetic, optical, solid state, etc. or mechanical memories such as paper tape, typed or hand-written books or records, etc. The continuity evaluation-fault detection information and load evaluation-fault detection information can, if desired, also be recorded or stored in any suitable prior art memory unit such as electromagnetic memories or mechanical memories. The continuity evaluation-fault detection information and load evaluation-fault detection information can be compared to the continuity evaluation-reference measurement information and load evaluation-reference measurement information, respectively, with a computer or microprocessor or manually to determine if the continuity evaluation-fault detection information and load evaluation-fault detection information fall in the range or within the value designated by the continuity evaluation-reference measurement information and load evaluation-reference measurement information to generate continuity fault-identification information and load fault-identification information.

Figure 12:
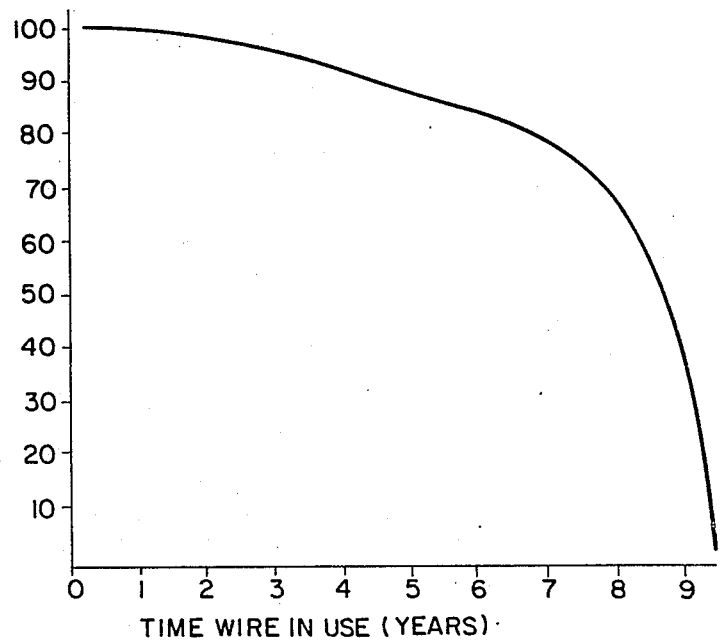
FIG. 12 is a graph illustrating the theoretical gradual normal decline of the health of a wire with use in an aircraft.

The graph of FIG. 12 illustrates the theoretical gradual normal decline of the health of a wire with use in an aircraft. In FIG. 12 the health of a wire is represented by the current carrying capacity of the wire as a percentage of the current carrying capacity expected when the wire is new, not damaged, and properly installed in an aircraft. FIG. 12 indicates that when an undamaged wire is initially installed in an aircraft, the current carrying capacity of the wire will be optimal or 100%. The method and apparatus of the invention can be utilized to monitor the gradual decline in the health of a wire and to permit the wire to be repaired or replaced before the deterioration of the wire causes a malfunction in the LRU or other equipment aboard an aircraft. For example, in FIG. 12 a wire is illustrated which has a crimp along its length. When the wire is new, the crimp is illustrated as being secure. After the wire has been used from seven to eight years, the crimp is illustrated as having loosened, causing certain of the teeth in the crimp to lose contact with the wire. When the crimp becomes loose, the resistance of the wire increases, reducing the current carrying capacity of the wire. It is precisely this kind of condition which can cause intermittent failures in an aircraft. In practice, the time required for a wire to develop loose crimps, loose solder joints, loose pin connections, etc. varies.

Figure 11:
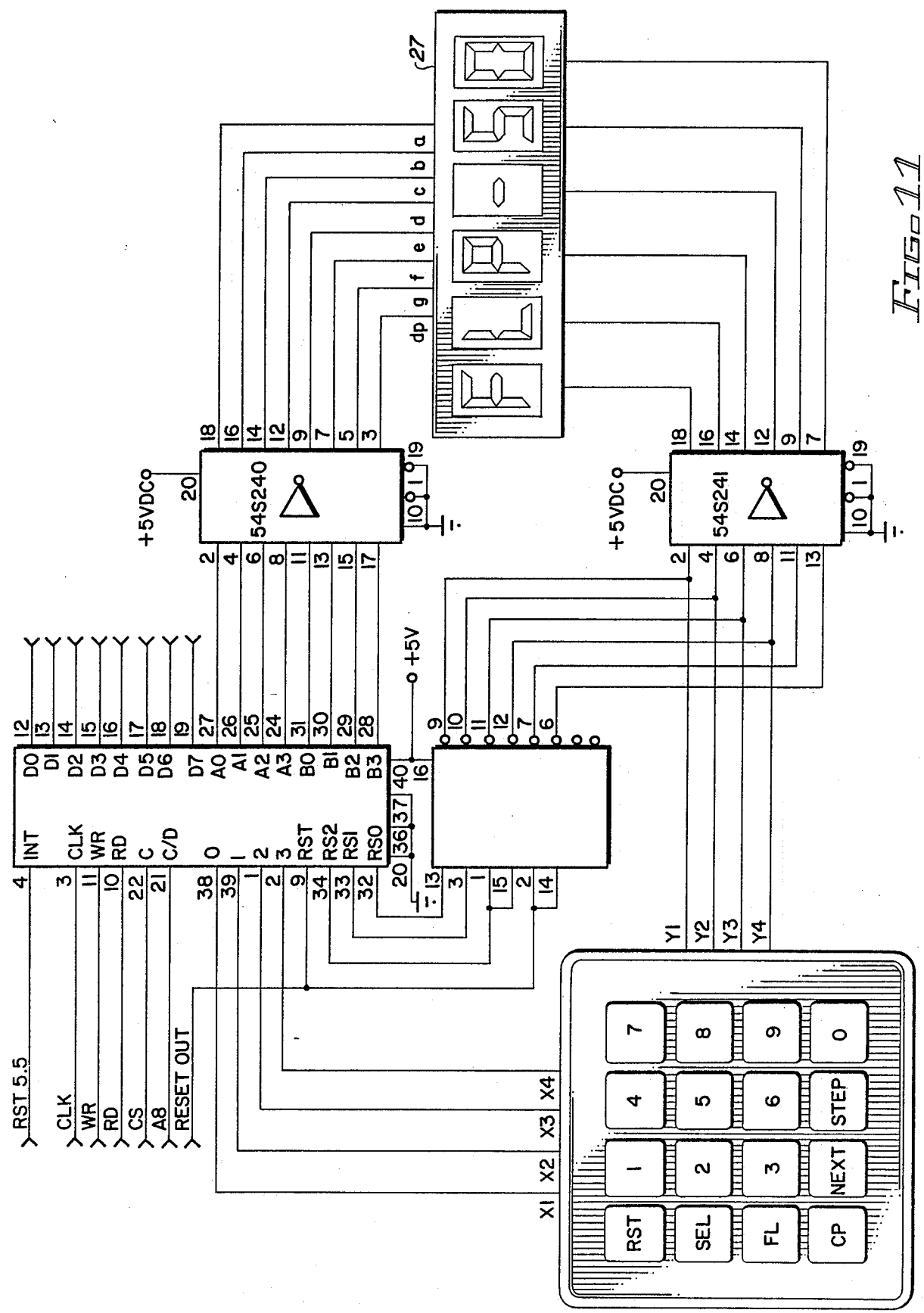
FIG. 11 is a schematic circuit drawing of circuitry which may be used to interface the keyboard and LED readout to the microprocessor within the control unit of FIG. 4, or alternatively, to interface the keyboard and LED readout to the microprocessor within the detector unit of FIG. 5.

The following Tables VII to XVI describe optional features for the harness integrity tester (HIT) apparatus of the invention and describe the functioning of the invention therewith. FIG. 11 illustrates circuitry which can be utilized as the interface between the keyboard 26 and readout 27 of the control unit 100, or, alternatively, which can be utilized as the interface between the keyboard 56 and readout 57 of the detector unit 200. As would be appreciated by those of skill in the art, the number of circuitry designs which can be utilized in the implementation of the invention is limitless. Such circuitry is readily designed by an electrical engineer of ordinary skill in the art.

TABLE VII

OPTIONAL OPERATIONAL TEST SPECIFICATION FOR HIT

CONTROL UNIT:
THE CONTROL UNIT WILL INCORPORATE THE FOLLOWING FUNCTIONS:
1. PROVIDE STIMULUS FOR CONTINUITY TEST
   a. PROVIDES MONITORING IN THE CASE OF JUMPERS
2. PROVIDE STIMULUS AND MONITORING FOR STRAY VOLTAGE TEST
3. PROVIDE STIMULUS FOR SERIES RESISTANCE TEST
   a. PROVIDES MONITORING IN THE CASE OF JUMPERS
4. INCORPORATE VISUAL DISPLAY FOR OPTION SELECTION AND FAULT INDICATIONS
5. PROVIDE OPERATOR INTERFACE FOR PATH UNDER TEST AND MODE SELECTION
6. POWER SUPPLY OPTIONS ARE INTERNAL BATTERY OR (SYSTEM) DEPENDENT

DETECTOR UNIT:
THE DETECTOR UNIT WILL INCORPORATE THE FOLLOWING FUNCTIONS:
1. PROVIDES THE LOADING / MONITORING FOR CONTINUITY TEST
2. PROVIDE STRAY VOLTAGE MONITORING TEST
3. PROVIDES THE LOADING / MONITORING USED FOR SERIES RESISTANCE TEST
4. INCORPORATE VISUAL DISPLAY FOR OPTION SELECTION AND FAULT INDICATIONS
5. PROVIDE OPERATOR INTERFACE FOR PATH UNDER TEST AND MODE SELECTION
6. POWER SUPPLY OPTIONS ARE INTERNAL BATTERY OR (SYSTEM) DEPENDENT

OPERATING CONDITIONS
1. MANUAL PATH SELECTION
2. HANDHELD/OR BEST OFF THE SHELF SIZE THAT CAN BE ACHIEVIED
3. DURABILITY REQUIREMENTS FOR PROTOTYPE "FRAGILE" NOT MIL. STANDARD
4. CONTINUITY AND NOT STRAY VOLTAGE FOR SERIES RESISTANCE CHECK TO BE PERFORMED.
5. GROUND WILL BE PROVIDED TO THE CONTROL AND DETECTOR UNITS THRU STRUCTURE CHASSIS BOND.

TABLE VIII

OPTIONAL DISPLAY CODES FOR HIT

Note: The display readouts listed on the following page would appear in the control unit LED readout 27 and/or the detector unit LED readout 57.

(HIT) DISPLAY DESCRIPTION

| F L P - S O |
|---|

| Display Reads | Display Indicates |
|---|---|
| CP | CONTINUITY PRESENT TEST |
| FL | FULL LOAD TEST |
| SP | STRAY VOLTAGE PRESENT |
| DSP-50 | DEAD SHORT PIN 50 |
| FLP-50 | FULL LOAD PIN 50 |
| CPP-50 | CONTINUITY PRESENT PIN 50 |
| SPP-50 | STRAY VOLTAGE PRESENT PIN 50 |
| -Error | CONTROLLER / DETECTOR ERROR MESSAGE INDICATING A FULL LOAD TEST WAS SELECTED BEFORE A CONTINUITY TEST HAD BEEN VALIDATED ON THE SELECT PIN. |
| PASS | CONTINUITY TEST OR FULL LOAD TEST PASSED (ON DETECTOR DISPLAY) |
| FAIL | CONTINUITY TEST OR FULL LOAD TEST FAILED(ON DETECTOR DISPLAY) |
| SEL | SEL BUTTON HAS BEEN DEPRESSED |
| RES | RES BUTTON HAS BEEN DEPRESSED |

TABLE IX

OPTIONAL KEYBOARD FOR HIT CONTROL AND DETECTOR UNITS

Note: The keys which have a digit identifying the key and are illustrated in the keyboard on the following page are utilized to input into the control or detector unit microprocessor numbers designating particular pins or wires.

(HIT) FUNCTION KEY DESCRIPTION

| KEY INPUT | CONTROLLER FUNCTIONS | KEY INPUT | DETECTOR FUNCTION |
|---|---|---|---|
| (RST) | RESETS PC TO 0 CLEARS ALL RELAYS & DISPLAYS (SELFUN) ON DISPLAY. CLEARS ALL RAM LOCATIONS. | (RST) | RESETS PC TO 0 CLEARS ALL RELAYS & DISPLAYS (SELFUN) ON DISPLAY. CLEARS ALL RAM LOCATIONS. |
| (SEL) | OPERATOR INPUT TO SELECT FUNCTION. | (SEL) | OPERATOR INPUT TO SELECT FUNCTION. |
| (CP) | OPERATOR INPUT TO SELECT CONTINUITY TEST ON DESIGNATED PIN. (OUTPUT IS A CONSTANT CURRENT). AUTO SCAN FOR STRAY VOLTAGE ON ALL OTHER PINS IN CONTROLLER CONNECTOR | (CP) | OPERATOR INPUT TO SELECT CONTINUITY TEST ON DESIGNATED PIN. (SELECTS LOW CURRENT LOAD). AUTO SCAN FOR STRAY VOLTAGE ON ALL OTHER PINS IN DETECTOR CONNECTOR. |
| (FL) | OPERATOR INPUT TO SELECT (HIGH CURRENT) CONTINUITY TEST ON DESIGNATED PIN. OUTPUT IS A CONSTANT CURRENT. AUTO SCAN FOR STRAY VOLTAGE ON ALL OTHER PINS IN CONTROLLER CONNECTOR | (FL) | OPERATOR INPUT TO SELECT (HIGH CURRENT) CONTINUITY TEST ON DESIGNATED PIN. SELECTS (HIGH CURRENT LOAD). AUTO SCAN FOR STRAY VOLTAGE ON ALL OTHER PINS IN DETECTOR CONNECTOR. |
| (NEXT) | OPERATOR INPUT TO INITIATE (CP) TEST ON NEXT SEQUENTIAL PIN. * UNIT WILL NOT INITIATE (FL) TEST UNLESS OPERATOR DEPRESSES (FL) KEY. | (NEXT) | OPERATOR INPUT TO INITIATE (CP) TEST ON NEXT SEQUENTIAL PIN. * UNIT WILL NOT INITIATE (FL) TEST UNLESS OPERATOR DEPRESSES (FL) KEY. |
| (STEP) | OPERATOR INPUT, ALLOWING THE OPERATOR TO DISPLAY THE NEXT SEQUENTIAL STRAY VOLTAGE FAILURE, IF MULTIPLE FAILURES HAVE BEEN DETECTED. | (STEP) | OPERATOR INPUT, ALLOWING THE OPERATOR TO DISPLAY THE NEXT SEQUENTIAL STRAY VOLTAGE FAILURE, IF MULTIPLE FAILURES HAVE BEEN DETECTED. |

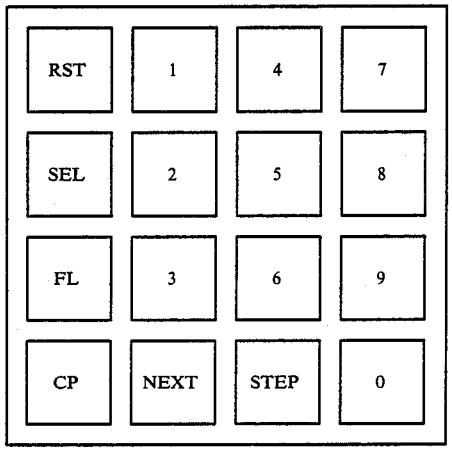

TABLE X
MECHANIZATION SEQUENCE FOR HIT WITH OPTIONAL FEATURES DESCRIBED IN TABLES VII, VIII AND IX: NO FAILURES IN HARNESS WIRE OR IN CANNON PLUG PINS

| | (HIT) MECHANIZATION SEQUENCE NORMAL OPERATION | | * (NO FAILURES) |
|---|---|---|---|
| CNTRLER ········ (RST) | OPERATOR INPUT RESET FUNCTION KEY HAS BEEN DEPRESSED (DISPLAY READS) (SELFUN) | DETECTOR ········ (RST) | OPERATOR INPUT RESET FUNCTION KEY HAS BEEN DEPRESSED (DISPLAY READS) (SELFUN) |

-continued
(HIT) MECHANIZATION SEQUENCE
NORMAL OPERATION       * (NO FAILURES)

| CNTRLER (SEL) | OPERATOR INPUT SELECT FUNCTION KEY HAS BEEN DEPRESSED (DISPLAY READS) (SEL- - -) | DETECTOR (SEL) | OPERATOR INPUT SELECT FUNCTION KEY HAS BEEN DEPRESSED (DISPLAY READS) (SEL- - -) |

INDICATING OPERATOR INPUT OF FUNCTION IS EXPECTED.

INDICATING OPERATOR INPUT OF FUNCTION IS EXPECTED.

| CNTRLER (CP) | OPERATOR INPUT (CP) FUNCTION KEY HAS BEEN DEPRESSED (DISPLAY READS) (CP- - - -) | DETECTOR (CP) | OPERATORS INPUT (CP) FUNCTION KEY HAS BEEN DEPRESSED (DISPLAY READS) (CP- - - -) |

INDICATING OPERATOR INPUT OF FUNCTION KEY FOR CONTINUITY TEST HAS BEEN SELECTED. CONTROLLER UNIT WAITING FOR PIN NUMBER TO BE INPUT.

INDICATING OPERATOR INPUT OF FUNCTION KEY FOR CONTINUITY TEST HAS BEEN SELECTED. DETECTOR UNIT WAITING FOR PIN NUMBER TO BE INPUT.

| CNTRLER (CP) | OPERATOR INPUT PIN 50 HAS BEEN ENTERED (DISPLAY READS) (CPP-50) | DETECTOR (CP) | OPERATOR INPUT PIN 50 HAS BEEN ENTERED (DISPLAY READS) (CPP-50) |

INDICATING OPERATOR INPUT OF PIN 50 FOR CONTINUITY TEST. CONTROLLER OUTPUT IS A LOW CURRENT SOURCE ON PIN 50. AUTO SCAN FOR STRAY VOLTAGE ON ALL OTHER PINS IN CONTROLLER CONNECTOR.

INDICATING OPERATOR INPUT OF PIN 50 FOR CONTINUITY TEST. DETECTOR OUTPUT PROVIDES LOW CURRENT LOAD ON PIN 50. AUTO SCAN FOR STRAY VOLTAGE ON ALL OTHER PINS IN DETECTOR CONNECTOR.

| CNTRLER (CP) | OPERATOR INPUT NONE (DISPLAY READS) (CPP-50) | DETECTOR (CP) | OPERATOR INPUT NONE (DISPLAY READS) (PASS50) |

DISPLAY INDICATES CONTINUITY TEST ON PIN 50. NO STRAY VOLTAGE DETECTED ON OTHER PINS IN THE CONTROLLER CONN.

DISPLAY INDICATES CONTINUITY TEST PASS ON PIN 50. NO STRAY VOLTAGE DETECTED ON OTHER PINS IN THE DETECTOR CONN.

| CNTRLER (FL) | OPERATOR INPUT (FL) FUNCTION KEY HAS BEEN DEPRESSED (DISPLAY READS) (FL- - - -) | DETECTOR (FL) | OPERATOR INPUT (FL) FUNCTION KEY HAS BEEN DEPRESSED (DISPLAY READS) (FL- - - -) |

INDICATING OPERATOR INPUT OF FUNCTION KEY FOR (HIGH CURRENT) CONTINUITY TEST SELECTED. CONTROLLER UNIT WAITING FOR PIN NUMBER TO BE INPUT. IF PIN SELECTED HAS NOT BEEN (CP) TESTED, UNIT WILL DISPLAY (-Error).

INDICATING OPERATOR INPUT OF FUNCTION KEY FOR (HIGH CURRENT) CONTINUITY TEST SELECTED. DETECTOR UNIT WAITING FOR PIN NUMBER TO BE INPUT. IF PIN SELECTED HAS NOT BEEN (CP) TESTED, UNIT WILL DISPLAY (-Error).

| CNTRLER (FL) | OPERATOR INPUT PIN 50 HAS BEEN ENTERED (DISPLAY READS) (FLP-50) | DETECTOR (FL) | OPERATOR INPUT PIN 50 HAS BEEN ENTERED (DISPLAY READS) (FLP-50) |

INDICATING OPERATOR INPUT OF PIN 50 FOR (HIGH CURRENT) CONTINUITY TEST. OUTPUT IS A HIGH CURRENT SOURCE ON PIN 50. AUTO SCAN FOR STRAY VOLTAGE ON ALL OTHER PINS IN CONTROLLER CONNECTOR.

INDICATING OPERATOR INPUT OF PIN 50 FOR (HIGH CURRENT) CONTINUITY TEST. PROVIDES HIGH CURRENT LOAD ON PIN 50. AUTO SCAN FOR STRAY VOLTAGE ON ALL OTHER PINS IN DETECTOR CONNECTOR.

| CNTRLER (FL) | OPERATOR INPUT NONE (DISPLAY READS) (FLP-50) | DETECTOR (FL) | OPERATOR INPUT NONE (DISPLAY READS) (PASS50) |

DISPLAY INDICATES (FL) TEST ON PIN 50. NO STRAY VOLTAGE DETECTED

DISPLAY INDICATES (FL) TEST PASS ON PIN 50. NO STRAY VOLTAGE DETECTED

-continued

|  |  |
|---|---|
| (HIT) MECHANIZATION SEQUENCE NORMAL OPERATION | * (NO FAILURES) |
| ON OTHER PINS IN THE CONTROLLER CONN. | ON OTHER PINS IN THE DETECTOR CONN. |

TABLE XI

MECHANIZATION SEQUENCE FOR HIT WITH OPTIONAL FEATURES DESCRIBED IN TABLES VII, VIII AND IX: FULL LOAD FAILURE

|  |  |
|---|---|
| (HIT) MECHANIZATION SEQUENCE | * (FL FAILURE) |

| CNTRLER (SEL) | OPERATOR INPUT SELECT FUNCTION KEY HAS BEEN DEPRESSED (DISPLAY READS) (SEL- - -) | DETECTOR (SEL) | OPERATOR INPUT SELECT FUNCTION KEY HAS BEEN DEPRESSED (DISPLAY READS) (SEL- - -) |
|---|---|---|---|
| | INDICATING OPERATOR INPUT OF FUNCTION IS EXPECTED | | INDICATING OPERATOR INPUT OF FUNCTION IS EXPECTED. |
| CNTRLER (CP) | OPERATOR INPUT (CP) FUNCTION KEY HAS BEEN DEPRESSED (DISPLAY READS) (CP- - - -) | DETECTOR (CP) | OPERATOR INPUT (CP FUNCTION KEY HAS BEEN DEPRESSED (DISPLAY READS) (CP- - - -) |
| | INDICATING OPERATOR INPUT OF FUNCTION KEY FOR CONTINUITY TEST HAS BEEN SELECTED. CONTROLLER UNIT WAITING FOR PIN NUMBER TO BE INPUT. | | INDICATING OPERATOR INPUT OF FUNCTION KEY FOR CONTINUITY TEST HAS BEEN SELECTED. DETECTOR UNIT WAITING FOR PIN NUMBER TO BE INPUT. |
| CNTRLER (CP) | OPERATOR INPUT PIN 50 HAS BEEN ENTERED (DISPLAY READS) (CPP-50) | DETECTOR (CP) | OPERATOR INPUT PIN 50 HAS BEEN ENTERED (DISPLAY READS) (CPP-50) |
| | INDICATING OPERATOR INPUT OF PIN 50 FOR CONTINUITY TEST. CONTROLLER OUTPUT IS A LOW CURRENT SOURCE ON PIN 50. AUTO SCAN FOR STRAY VOLTAGE ON ALL OTHER PINS IN CONTROLLER CONNECTOR. | | INDICATING OPERATOR INPUT OF PIN 50 FOR CONTINUITY TEST. DETECTOR OUTPUT PROVIDES LOW CURRENT LOAD ON PIN 50. AUTO SCAN FOR STRAY VOLTAGE ON ALL OTHER PINS IN DETECTOR CONNECTOR. |
| CNTRLER (CP) | OPERATOR INPUT NONE (DISPLAY READS) (CPP-50) | DETECTOR (CP) | OPERATOR INPUT NONE (DISPLAY READS) (PASS50) |
| | DISPLAY INDICATES CONTINUITY TEST ON PIN 50. NO STRAY VOLTAGE DETECTED ON OTHER PINS IN THE CONTROLLER CONN. | | DISPLAY INDICATES CONTINUITY TEST PASS ON PIN 50. NO STRAY VOLTAGE DETECTED ON OTHER PINS IN THE DETECTOR CONN. |
| CNTRLER (FL) | OPERATOR INPUT (FL) FUNCTION KEY HAS BEEN DEPRESSED (DISPLAY READS) (FL- - - -) | DETECTOR (FL) | OPERATOR INPUT (FL) FUNCTION KEY HAS BEEN DEPRESSED (DISPLAY READS) (FL- - - -) |
| | INDICATING OPERATOR INPUT OF FUNCTION KEY FOR (HIGH CURRENT) CONTINUITY TEST SELECTED. CONTROLLER UNIT WAITING FOR PIN NUMBER TO BE INPUT. IF PIN SELECTED HAS NOT BEEN (CP) TESTED, UNIT WILL DISPLAY (-Error). | | INDICATING OPERATOR INPUT OF FUNCTION KEY FOR (HIGH CURRENT) CONTINUITY TEST SELECTED. DETECTOR UNIT WAITING FOR PIN NUMBER TO BE INPUT. IF PIN SELECTED HAS NOT BEEN (CP) TESTED, UNIT WILL DISPLAY (-Error). |
| CNTRLER (FL) | OPERATOR INPUT PIN 50 HAS BEEN ENTERED (DISPLAY READS) (FLP-50) | DETECTOR (FL) | OPERATOR INPUT PIN 50 HAS BEEN ENTERED (DISPLAY READS) (FLP-50) |
| | INDICATING OPERATOR INPUT OF PIN 50 FOR (HIGH CURRENT) CONTINUITY TEST. OUTPUT IS A HIGH CURRENT SOURCE ON PIN 50. AUTO SCAN FOR STRAY VOLTAGE ON ALL | | INDICATING OPERATOR INPUT OF PIN 50 FOR (HIGH CURRENT) CONTINUITY TEST. PROVIDES HIGH CURRENT LOAD ON PIN 50. AUTO SCAN FOR STRAY VOLTAGTE ON ALL |

|  (HIT) |  |
| --- | --- |
| MECHANIZATION SEQUENCE | * (FL FAILURE) |
| OTHER PINS IN CONTROLLER CONNECTOR. | OTHER PINS IN DETECTOR CONNECTOR. |
| ┌─────────┐  OPERATOR<br>│ CNTRLER │  INPUT<br>│ ------- │  NONE<br>│  (FL)   │  (DISPLAY READS)<br>└─────────┘  (FLP-50)<br>DISPLAY INDICATES (FL) TEST<br>ON PIN 50. NO STRAY VOLTAGE DETECTED<br>ON OTHER PINS IN THE CONTROLLER CONN. | ┌─────────┐  OPERATOR<br>│ DETECTOR│  INPUT<br>│ ------- │  NONE<br>│  (FL)   │  (DISPLAY READS)<br>└─────────┘  (FAIL50)<br>DISPLAY INDICATES (FL) TEST FAILS<br>ON PIN 50. NO STRAY VOLTAGE DETECTED<br>ON OTHER PINS IN THE DETECTOR CONN. |

TABLE XII

MECHANIZATION SEQUENCE FOR HIT WITH OPTIONAL FEATURES DESCRIBED IN TABLES VII, VIII, AND IX: CONTINUITY TEST FAILURE

TABLE XIII

MECHANIZATION SEQUENCE FOR HIT WITH OPTIONAL FEATURES DESCRIBED IN TABLES VII, VIII, AND IX: DEAD SHORT FAILURE

|  (HIT) |  |
| --- | --- |
| MECHANIZATION SEQUENCE | * (CP FAILURE) |
| ┌─────────┐  OPERATOR<br>│ CNTRLER │  INPUT<br>│ ------- │  SELECT FUNCTION KEY<br>│  (SEL)  │  HAS BEEN DEPRESSED<br>└─────────┘  (DISPLAY READS)<br>             (SEL- - -)<br>INDICATING OPERATOR INPUT OF FUNCTION<br>IS EXPECTED | ┌─────────┐  OPERATOR<br>│ DETECTOR│  INPUT<br>│ ------- │  SELECT FUNCTION KEY<br>│  (SEL)  │  HAS BEEN DEPRESSED<br>└─────────┘  (DISPLAY READS)<br>             (SEL- - -)<br>INDICATING OPERATOR INPUT OF FUNCTION<br>IS EXPECTED |
| ┌─────────┐  OPERATOR<br>│ CNTRLER │  INPUT<br>│ ------- │  (CP) FUNCTION KEY<br>│  (CP)   │  HAS BEEN DEPRESSED<br>└─────────┘  (DISPLAY READS)<br>             (CP- - - -)<br>INDICATING OPERATOR INPUT OF FUNCTION<br>KEY FOR CONTINUITY TEST HAS BEEN<br>SELECTED. CONTROLLER UNIT WAITING FOR<br>PIN NUMBER TO BE INPUT. | ┌─────────┐  OPERATOR<br>│ DETECTOR│  INPUT<br>│ ------- │  (CP) FUNCTION KEY<br>│  (CP)   │  HAS BEEN DEPRESSED<br>└─────────┘  (DISPLAY READS)<br>             (CP- - - -)<br>INDICATING OPERATOR INPUT OF FUNCTION<br>KEY FOR CONTINUITY TEST HAS BEEN<br>SELECTED. DETECTOR UNIT WAITING FOR<br>PIN NUMBER TO BE INPUT. |
| ┌─────────┐  OPERATOR<br>│ CNTRLER │  INPUT<br>│ ------- │  PIN 50<br>│  (CP)   │  HAS BEEN ENTERED<br>└─────────┘  (DISPLAY READS)<br>             (CPP-50)<br>INDICATING OPERATOR INPUT OF PIN 50<br>FOR CONTINUITY TEST. CONTROLLER OUTPUT<br>IS A LOW CURRENT SOURCE ON PIN 50. AUTO<br>SCAN FOR STRAY VOLTAGE ON ALL OTHER<br>PINS IN CONTROLLER CONNECTOR. | ┌─────────┐  OPERATOR<br>│ DETECTOR│  INPUT<br>│ ------- │  PIN 50<br>│  (CP)   │  HAS BEEN ENTERED<br>└─────────┘  (DISPLAY READS)<br>             (CPP-50)<br>INDICATING OPERATOR INPUT OF PIN 50<br>FOR CONTINUITY TEST. DETECTOR OUTPUT<br>PROVIDES LOW CURRENT LOAD ON PIN 50.<br>AUTO SCAN FOR STRAY VOLTAGE ON ALL<br>OTHER PINS IN DETECTOR CONNECTOR. |
| ┌─────────┐  OPERATOR<br>│ CNTRLER │  INPUT<br>│ ------- │  NONE<br>│  (CP)   │  (DISPLAY READS)<br>└─────────┘  (CPP-50)<br>DISPLAY INDICATES CONTINUITY TEST<br>ON PIN 50. NO STRAY VOLTAGE DETECTED<br>ON OTHER PINS IN THE CONTROLLER CONN. | ┌─────────┐  OPERATOR<br>│ DETECTOR│  INPUT<br>│ ------- │  NONE<br>│  (CP)   │  (DISPLAY READS)<br>└─────────┘  (FAIL50)<br>DISPLAY INDICATES CONTINUITY TEST FAILS<br>ON PIN 50. NO STRAY VOLTAGE DETECTED<br>ON OTHER PINS IN THE DETECTOR CONN. |

|  (HIT) |  |
| --- | --- |
| MECHANIZATION SEQUENCE | * (DS FAILURE) |
| ┌─────────┐  OPERATOR<br>│ CNTRLER │  INPUT<br>│ ------- │  SELECT FUNCTION KEY<br>│  (SEL)  │  HAS BEEN DEPRESSED<br>└─────────┘  (DISPLAY READS)<br>             (SEL- - -)<br>INDICATING OPERATOR INPUT OF FUNCTION<br>IS EXPECTED | ┌─────────┐  OPERATOR<br>│ DETECTOR│  INPUT<br>│ ------- │  SELECT FUNCTION KEY<br>│  (SEL)  │  HAS BEEN DEPRESSED<br>└─────────┘  (DISPLAY READS)<br>             (SEL- - -)<br>INDICATING OPERATOR INPUT OF FUNCTION<br>IS EXPECTED |

-continued

| (HIT) MECHANIZATION SEQUENCE | | * (DS FAILURE) | |
|---|---|---|---|
| CNTRLER ──────── (CP) | OPERATOR INPUT (CP) FUNCTION KEY HAS BEEN DEPRESSED (DISPLAY READS) (CP- - - -) | DETECTOR ──────── (CP) | OPERATOR INPUT (CP) FUNCTION KEY HAS BEEN DEPRESSED (DISPLAY READS) (CP- - - -) |
| INDICATING OPERATOR INPUT OF FUNCTION KEY FOR CONTINUITY TEST HAS BEEN SELECTED. CONTROLLER UNIT WAITING FOR PIN NUMBER TO BE INPUT. | | INDICATING OPERATOR INPUT OF FUNCTION KEY FOR CONTINUITY TEST HAS BEEN SELECTED. DETECTOR UNIT WAITING FOR PIN NUMBER TO BE INPUT. | |
| CNTRLER ──────── (CP) | OPERATOR INPUT PIN 50 HAS BEEN ENTERED (DISPLAY READS) (CPP-50) | DETECTOR ──────── (CP) | OPERATOR INPUT PIN 50 HAS BEEN ENTERED (DISPLAY READS) (CPP-50) |
| INDICATING OPERATOR INPUT OF PIN 50 FOR CONTINUITY TEST. CONTROLLER OUTPUT IS A LOW CURRENT SOURCE ON PIN 50. AUTO SCAN FOR STRAY VOLTAGE ON ALL OTHER PINS IN CONTROLLER CONNECTOR. | | INDICATING OPERATOR INPUT OF PIN 50 FOR CONTINUITY TEST. DETECTOR OUTPUT PROVIDES LOW CURRENT LOAD ON PIN 50. AUTO SCAN FOR STRAY VOLTAGE ON ALL OTHER PINS IN DETECTOR CONNECTOR. | |
| CNTRLER ──────── (CP) | OPERATOR INPUT NONE (DISPLAY READS) (DSP-50) | DETECTOR ──────── (CP) | OPERATOR INPUT NONE (DISPLAY READS) (CPP-50) |
| DISPLAY INDICATES DEAD SHORT ON PIN 50. DEPRESS THE (SEL) FUNCTION KEY TO INITIATE A NEW TEST. | | DISPLAY INDICATES CONTINUITY TEST ON PIN 50. DEPRESS THE (SEL) FUNCTION KEY TO INITIATE A NEW TEST. | |

TABLE XIV

MECHANIZATION SEQUENCE FOR HIT WITH OPTIONAL FEATURES DESCRIBED IN TABLES VI, VIII, AND IX: STRAY VOLTAGE FAILURE IN CANNON PLUG ATTACHED TO CONTROLLER

| (HIT) MECHANIZATION SEQUENCE | | * (SP FAILURE CNTRLER CONN. | |
|---|---|---|---|
| CNTRLER ──────── (SEL) | OPERATOR INPUT SELECT FUNCTION KEY HAS BEEN DEPRESSED (DISPLAY READS) (SEL- - -) | DETECTOR ──────── (SEL) | OPERATOR INPUT SELECT FUNCTION KEY HAS BEEN DEPRESSED (DISPLAY READS) (SEL- - -) |
| INDICATING OPERATOR INPUT OF FUNCTION IS EXPECTED | | INDICATING OPERATOR INPUT OF FUNCTION IS EXPECTED | |
| CNTRLER ──────── (CP) | OPERATOR INPUT (CP) FUNCTION KEY HAS BEEN DEPRESSED (DISPLAY READS) (CP- - - -) | DETECTOR ──────── (CP) | OPERATOR INPUT (CP) FUNCTION KEY HAS BEEN DEPRESSED (DISPLAY READS) (CP- - - -) |
| INDICATING OPERATOR INPUT OF FUNCTION KEY FOR CONTINUITY TEST HAS BEEN SELECTED. CONTROLLER UNIT WAITING FOR PIN NUMBER TO BE INPUT. | | INDICATING OPERATOR INPUT OF FUNCTION KEY FOR CONTINUITY TEST HAS BEEN SELECTED. DETECTOR UNIT WAITING FOR PIN NUMBER TO BE INPUT. | |
| CNTRLER ──────── (CP) | OPERATOR INPUT PIN 50 HAS BEEN ENTERED (DISPLAY READS) (CPP-50) | DETECTOR ──────── (CP) | OPERATOR INPUT PIN 50 HAS BEEN ENTERED (DISPLAY READS) (CPP-50) |
| INDICATING OPERATOR INPUT OF PIN 50 FOR CONTINUITY TEST. CONTROLLER OUTPUT IS A LOW CURRENT SOURCE ON PIN 50. AUTO SCAN FOR STRAY VOLTAGE ON ALL OTHER PINS IN CONTROLLER CONNECTOR. | | INDICATING OPERATOR INPUT OF PIN 50 FOR CONTINUITY TEST. DETECTOR OUTPUT PROVIDES LOW CURRENT LOAD ON PIN 50. AUTO SCAN FOR STRAY VOLTAGE ON ALL OTHER PINS IN DETECTOR CONNECTOR. | |

-continued

|  | (HIT) MECHANIZATION SEQUENCE |  | * (SP FAILURE CNTRLER CONN. |
|---|---|---|---|
| CNTRLER<br>- - - - - - - -<br>(CP) | OPERATOR<br>INPUT<br>NONE<br>(DISPLAY READS)<br>(SPP-10)<br>DISPLAY INDICATES STRAY VOLTAGE WAS<br>DETECTED ON PIN 10. DEPRESS THE (STEP)<br>KEY TO DISPLAY THE NEXT PIN ON WHICH<br>STRAY VOLTAGE IS PRESENT. IF NONE, THE<br>UNIT WILL CYCLE AND PERFORM CP TEST ON<br>PIN 50. DEPRESS THE (SEL) FUNCTION KEY<br>50 INITIATE A NEW TEST. | DETECTOR<br>- - - - - - - -<br>(CP) | OPERATOR<br>INPUT<br>NONE<br>(DISPLAY READS)<br>(CPP-50)<br>DISPLAY INDICATES CONTINUITY TEST<br>ON PIN 50. NO STRAY VOLTAGE DETECTED<br>ON OTHER PINS IN THE DETECTOR CONN. |

TABLE XV

MECHANIZATION SEQUENCE FOR HIT WITH OPTIONAL FEATURES DESCRIBED IN TABLES VI, VIII AND IX: STRAY VOLTAGE FAILURE IN CANNON PLUG ATTACHED TO DETECTOR

|  | (HIT) MECHANIZATION SEQUENCE |  | * (SP FAILURE DETECTOR CONN. |
|---|---|---|---|
| CNTRLER<br>- - - - - - - -<br>(SEL) | OPERATOR<br>INPUT<br>SELECT FUNCTION KEY<br>HAS BEEN DEPRESSED<br>(DISPLAY READS)<br>(SEL- - -)<br>INDICATING OPERATOR INPUT OF FUNCTION<br>IS EXPECTED. | DETECTOR<br>- - - - - - - -<br>(SEL) | OPERATOR<br>INPUT<br>SELECT FUNCTION KEY<br>HAS BEEN DEPRESSED<br>(DISPLAY READS)<br>(SEL- - -)<br>INDICATING OPERATOR INPUT OF FUNCTION<br>IS EXPECTED. |
| CNTRLER<br>- - - - - - - -<br>-(CP) | OPERATOR<br>INPUT<br>(CP FUNCTION KEY<br>HAS BEEN DEPRESSED<br>(DISPLAY READS)<br>(CP- - - -)<br>INDICATING OPERATOR INPUT OF FUNCTION<br>KEY FOR CONTINUITY TEST HAS BEEN<br>SELECTED. CONTROLLER UNIT WAITING FOR<br>PIN NUMBER TO BE INPUT. | DETECTOR<br>- - - - - - - -<br>(CP) | OPERATOR<br>INPUT<br>(CP) FUNCTION KEY<br>HAS BEEN DEPRESSED<br>(DISPLAY READS)<br>(CP- - - -)<br>INDICATING OPERATOR INPUT OF FUNCTION<br>KEY FOR CONTINUITY TEST HAS BEEN<br>SELECTED. DETECTOR UNIT WAITING FOR<br>PIN NUMBER TO BE INPUT. |
| CNTRLER<br>- - - - - - - -<br>(CP) | OPERATOR<br>INPUT<br>PIN 50<br>HAS BEEN ENTERED<br>(DISPLAY READS)<br>(CPP-50)<br>INDICATING OPERATOR INPUT OF PIN 50<br>FOR CONTINUITY TEST. CONTROLLER OUTPUT<br>IS A LOW CURRENT SOURCE ON PIN 50. AUTO<br>SCAN FOR STRAY VOLTAGE ON ALL OTHER<br>PINS IN CONTROLLER CONNECTOR. | DETECTOR<br>- - - - - - - -<br>(CP) | OPERATOR<br>INPUT<br>PIN 50<br>HAS BEEN ENTERED<br>(DISPLAY READS)<br>(CPP-50)<br>INDICATING OPERATOR INPUT OF PIN 50<br>FOR CONTINUITY TEST. DETECTOR OUTPUT<br>PROVIDES LOW CURRENT LOAD ON PIN 50.<br>AUTO SCAN FOR STRAY VOLTAGE ON ALL<br>OTHER PINS IN DETECTOR CONNECTOR. |
| CNTRLER<br>- - - - - - - -<br>(CP) | OPERATOR<br>INPUT<br>NONE<br>(DISPLAY READS)<br>(CPP-50)<br>DISPLAY INDICATES CONTINUITY TEST ON<br>PIN 50. NO STRAY VOLTAGE DETECTED<br>ON OTHER PINS IN THE CONTROLLER CONN. | DETECTOR<br>- - - - - - - -<br>(CP) | OPERATOR<br>INPUT<br>NONE<br>(DISPLAY READS)<br>(SPP-10)<br>DISPLAY INDICATES STRAY VOLTAGE WAS<br>DETECTED ON PIN 10. DEPRESS THE (STEP)<br>KEY TO DISPLAY THE NEXT PIN ON WHICH<br>STRAY VOLTAGE IS PRESENT. IF NONE, THE<br>UNIT WILL CYCLE AND PERFORM CP TEST ON<br>PIN 50. DEPRESS THE (SEL) FUNCTION KEY<br>TO INITIATE A NEW TEST. |

TABLE XVI

MECHANIZATION SEQUENCE FOR HIT WITH OPTIONAL FEATURES DESCRIBED IN TABLES VII, VIII, AND IX: STRAY VOLTAGE FAILURE IN BOTH CANNON PLUG ATTACHED TO CONTROLLER AND CANNON PLUG ATTACHED TO DETECTOR

| (HIT) MECHANIZATION SEQUENCE | | * (SP FAILURE IN BOTH) (CNTRLER & DETECTOR CONN.) | |
|---|---|---|---|
| CNTRLER (SEL) | OPERATOR INPUT SELECT FUNCTION KEY HAS BEEN DEPRESSED (DISPLAY READS) (SEL- - -) INDICATING OPERATOR INPUT OF FUNCTION IS EXPECTED. | DETECTOR (SEL) | OPERATOR INPUT SELECT FUNCTION KEY HAS BEEN DEPRESSED (DISPLAY READS) (SEL- - -) INDICATING OPERATOR INPUT OF FUNCTION IS EXPECTED. |
| CNTRLER (CP) | OPERATOR INPUT (CP) FUNCTION KEY HAS BEEN DEPRESSED (DISPLAY READS) (CP- - - -) INDICATING OPERATOR INPUT OF FUNCTION KEY FOR CONTINUITY TEST HAS BEEN SELECTED. CONTROLLER UNIT WAITING FOR PIN NUMBER TO BE INPUT. | DETECTOR (CP) | OPERATOR INPUT (CP) FUNCTION KEY HAS BEEN DEPRESSED (DISPLAY READS) (CP- - - -) INDICATING OPERATOR INPUT OF FUNCTION KEY FOR CONTINUITY TEST HAS BEEN SELECTED. DETECTOR UNIT WAITING FOR PIN NUMBER TO BE INPUT. |
| CNTRLER (CP) | OPERATOR INPUT PIN 50 HAS BEEN ENTERED (DISPLAY READS) (CPP-50) INDICATING OPERATOR INPUT OF PIN 50 FOR CONTINUITY TEST. CONTROLLER OUTPUT IS A LOW CURRENT SOURCE ON PIN 50. AUTO SCAN FOR STRAY VOLTAGE ON ALL OTHER PINS IN CONTROLLER CONNECTOR. | DETECTOR (CP) | OPERATOR INPUT PIN 50 HAS BEEN ENTERED (DISPLAY READS) (CPP-50) INDICATING OPERATOR INPUT OF PIN 50 FOR CONTINUITY TEST. DETECTOR OUTPUT PROVIDES LOW CURRENT LOAD ON PIN 50. AUTO SCAN FOR STRAY VOLTAGE ON ALL OTHER PINS IN DETECTOR CONNECTOR. |
| CNTRLER (CP) | OPERATOR INPUT NONE (DISPLAY READS) (SPP-20) DISPLAY INDICATES STRAY VOLTAGE WAS DETECTED ON PIN 20. DEPRESS THE (STEP) KEY TO DISPLAY THE NEXT PIN ON WHICH STRAY VOLTAGE IS PRESENT. IF NONE, THE UNIT WILL CYCLE AND PERFORM CP TEST ON PIN 50. DEPRESS THE (SEL) FUNCTION KEY TO INITIATE A NEW TEST. | DETECTOR (CP) | OPERATOR INPUT NONE (DISPLAY READS) (SPP-10) DISPLAY INDICATES STRAY VOLTAGE WAS DETECTED ON PIN 10. DEPRESS THE (STEP) KEY TO DISPLAY THE NEXT PIN ON WHICH STRAY VOLTAGE IS PRESENT. IF NONE, THE UNIT WILL CYCLE AND PERFORM CP TEST ON PIN 50. DEPRESS THE (SEL) FUNCTION KEY TO INITIATE A NEW TEST. |

Figure 9:
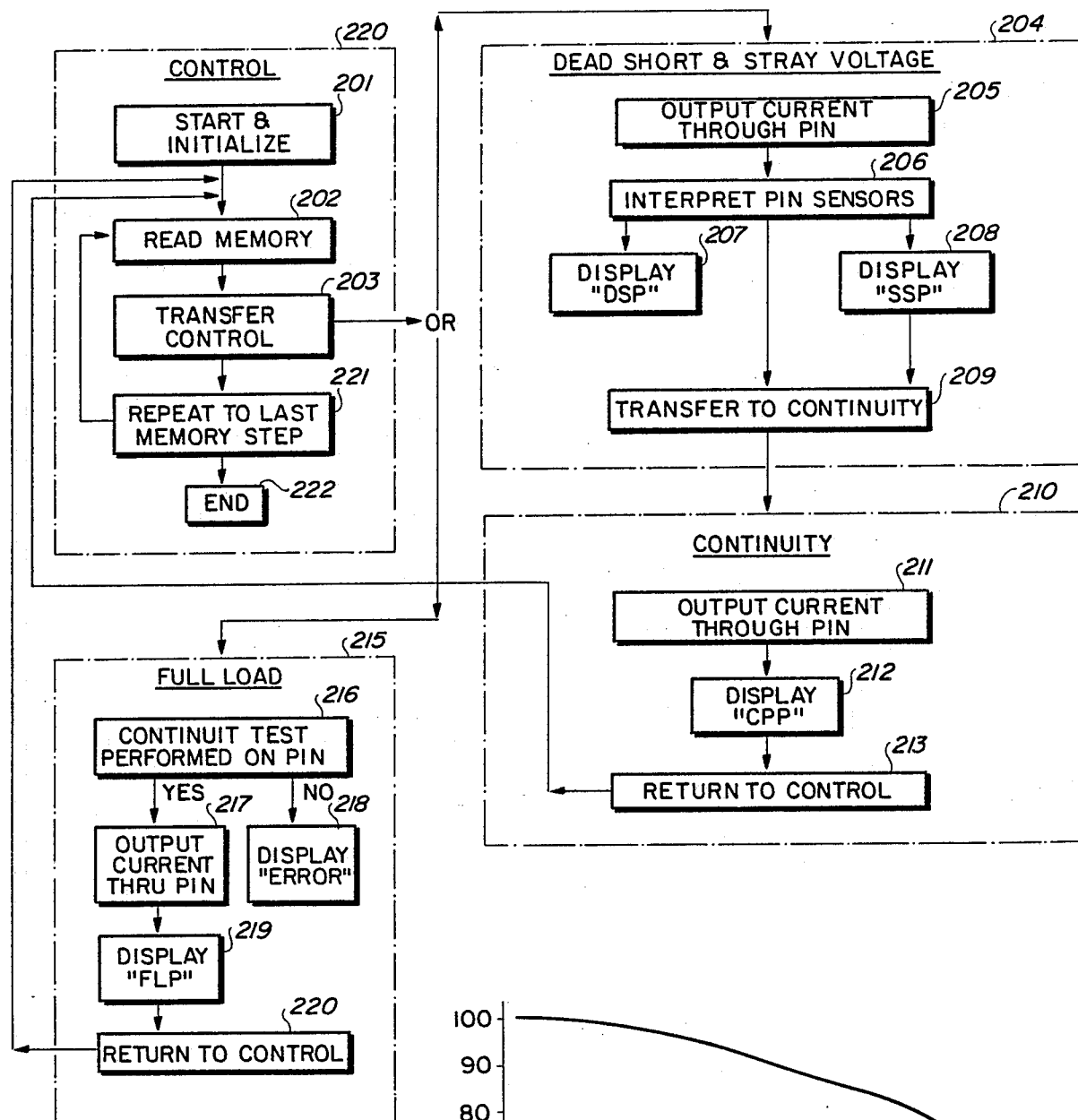
FIG. 9 is a block flow diagram illustrating a typical program or logic function executed by the microprocessor within the control unit of FIG. 4.

FIG. 9 is a block flow diagram which illustrates a typical program or logic function which is executed by the microprocessor 20 of the control unit 100. The diagram of FIG. 9 was prepared assuming that the control unit had the optional features identified and illustrated in Tables VII to XVI and FIG. 11 herein.

In FIG. 9, the basic control program 220 consists of commands to "start and initialize" 201, "read memory" 202, and "transfer control" 203 to either the dead short and stray voltage sub-routine 204 or the full load sub-routine 215.

The stray voltage sub-routine 204 consists of commands to "output current through pin" 205, "interpret pin sensors" 206, "display 'DSP'", "display 'SSP'", and "transfer to continuity" 209. The command "interpret pin sensors" 206 determines if electricity is present on any of the wires other than the wire being tested. When electricity is detected by the control unit in the cannon plug attached to the control unit on pins other than the pin being tested, then command 208 causes "SSP" to appear on LED readout 27. If a dead short is detected, then command 207 causes "DSP" to appear on LED readout 27. If no stray voltage signals or dead shorts are detected in the cannon plug attached to the control unit, then the "interpret pin sensors" 206 command is followed by the "transfer to continuity" 209 command. The "Display 'DSP'" 207 command is followed by return to the control program 220.

The continuity sub-routine 210 consists of commands to "output current through pin" 211, "display 'CPP'" 212, and "return to control" 213. When command 212 causes "CPP" to be displayed on readout 27, the control unit is outputting a continuity test current through the selected pin. After the continuity test is completed, command 213 returns the program logic to control 220.

The full load sub-routine 215 consists of commands to determine if "continuity test performed on pin" being tested 216, "output current through pin" 217, "display 'Error'" 218, "display 'FLP'" 219, and "return to control" 220. If a continuity test has not been performed on the pin being tested, command 218 causes "Error" to be displayed on readout 27 and the load test cannot be performed until a continuity test is performed. After command 218, the full load sub-routine 215 returns to control 220. If a continuity test 210 is performed on the pin for which a load test is desired, the full load sub-routine will proceed to output current through the pin and wire attached to the pin. When current for a full load test is being directed through a selected pin, command 219 causes "FLP" to appear on readout 27. After the full load test is completed, the full load subroutine 215 returns to control 220. The control program 220 and the dead short and stray voltage 204, continuity 210 and full load 215 sub-routines are repeated for other pins (and wires attached thereto) as indicated by the "repeat to last memory step" 221 of the control program 220 followed by an "end" program step 222 which completes the execution of the program.

Figure 10:
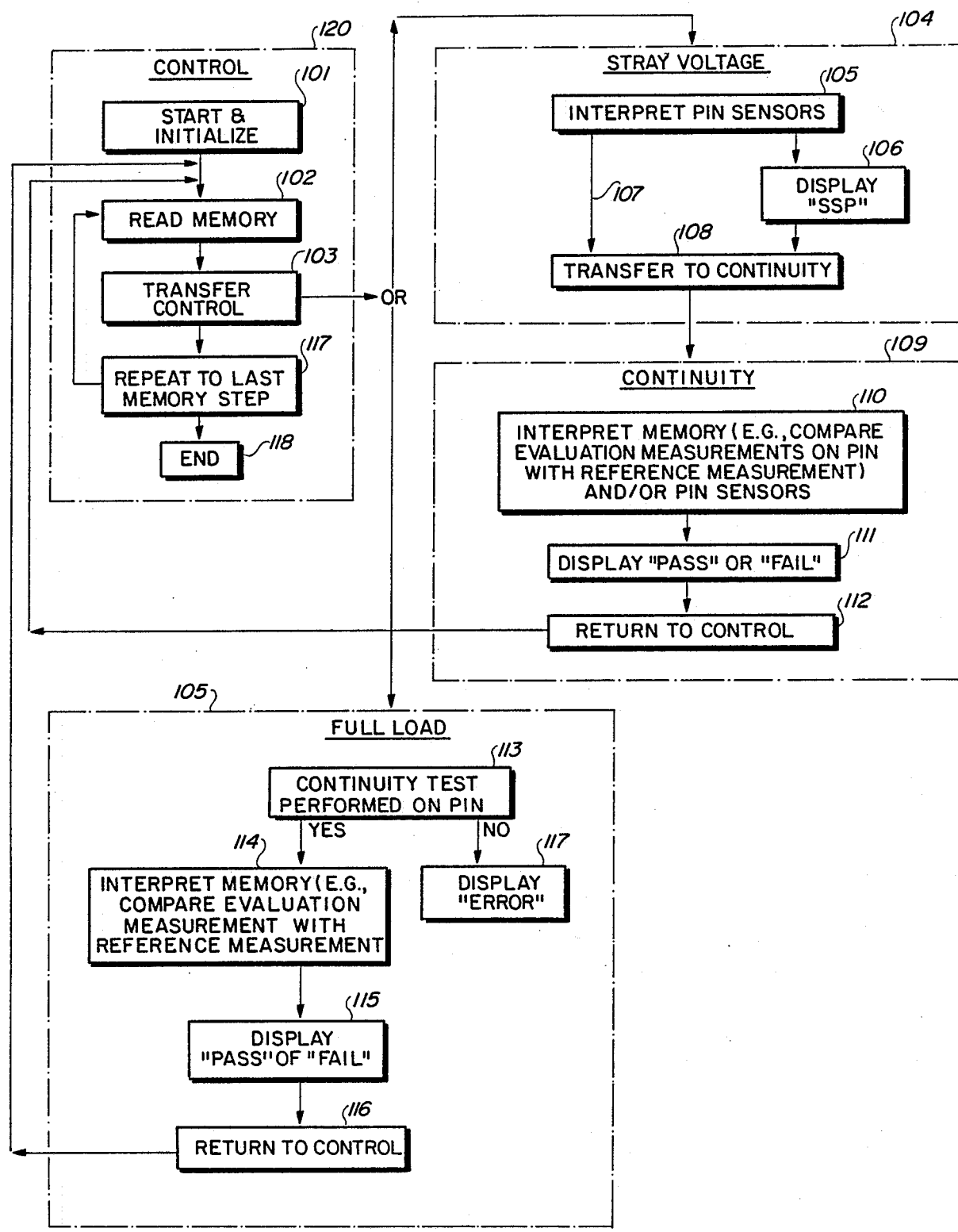
FIG. 10 is a block flow diagram illustrating a typical program or logic function executed by the microprocessor within the detector unit of FIG. 5.

FIG. 10 is a block flow diagram which illustrates a typical program or logic function which is executed by the microprocessor 50 of the detector unit 200. The diagram of FIG. 10 was prepared assuming that the detector unit had the optional features identified and illustrated in Tables VII to XVI and FIG. 11 herein.

In FIG. 10, the basic control program 120 consists of commands to "start and initialize" 101, "read memory" 102, and "transfer control" 103 to either the stray voltage sub-routine 104 or the full load sub-routine 105.

The stray voltage sub-routine 104 consists of commands to "interpret pin sensors" 105 to determine if electricity is present on any of the wires other than the wire being tested. When electricity is detected by the detector unit in the cannon plug attached to the detector unit on pins other than the pin being tested, then command 106 causes "SSP" to appear on LED readout 57. If no stray voltage signals are detected in the cannon plug attached to the detector unit, then the "interpret pin sensors" 105 command is followed 107 by "transfer to continuity" sub-routine 108. The "transfer to continuity" 108 command also follows the "display !SSP!" command 106.

The continuity sub-routine 109 consists of commands to "interpret memory" 110, "display 'PASS' or 'FAIL'" 111 and "return to control" 112. During "interpret memory" 110, continuity evaluation-reference measurement information is compared with continuity evaluation-fault detection information to generate continuity fault-identification information. The continuity fault-identification information indicates the amount of variance between the continuity evaluation-reference measurement information and the continuity evaluation-fault detection information. If the amount of variance is within the limitations programmed in the microprocessor 50, command 111 causes "PASS" to be displayed on readout 57. If the variance is not within defined limitations, command 111 causes "FAIL" to be displayed on readout 57. Alternatively, command 110 can cause the sensor monitoring the wire being tested to determine if any current is detected in the wire. If current is detected in the wire, command 111 causes "PASS" to appear on readout 57. If no current is detected, command 111 causes "FAIL" to appear on readout 57.

The full load sub-routine 105 consists of commands to determine if a "continuity test" has been performed on the pin being tested 113, "interpret memory" 114, "display 'PASS' or 'FAIL'" 115, "return to control" 116, and "display 'Error'" 117. During "interpret memory" 114, load evaluation-reference measurement information is compared with load evaluation-fault detection information to generate load fault-identification information. The load fault-identification information indicates the amount of variance between the load evaluation-reference measurement information and the load evaluation-fault detection information. If the amount of variance is within limitations programmed into the memory of microprocessor 50, command 115 causes "PASS" to be displayed on readout 57. If the variance is not with defined limits, command 115 causes "FAIL" to be displayed on readout 57.

If the continuity test has not been performed on the pin being tested, command 117 causes "Error" to be displayed on readout 57 and the load test cannot be performed until a continuity test is performed. After command 117, the full load sub-routine 105 returns to control 116. When the continuity test has been performed, the full load sub-routine 105 proceeds to the interpret memory command 114.

The control program 120 and the stray voltage 104, continuity 109, and full load 105 sub-routines are repeated for other pins (and wires attached thereto) as indicated by the "repeat to last memory step" 117 of the control program 120 followed by an "end" program step 118 which completes the execution of the program.

Having described my invention in such terms as to enable those skilled in the art to which it pertains to understand and practice it, and having described the presently preferred embodiments and best mode thereof, I claim:

1. A maintenance systems for detecting, in each of a plurality of generally identical cables, faults which cause intermittent attenuation of electromagnetic radiation transmitted through the cable, each of said cables including a plurality of lines extending the length of the cable, each of said cables having a first end including first connector means and having a second end including second connector means, each of said plurality of lines terminating at said first and second connector means, each of said first and second connector means normally being removably connected to mating means in a system, each of said connector means being disconnected from said mating means during utilization of said maintenance system, said maintenance system including:

(a) a transportable control unit including:
 (i) means for attaching said control unit to said first connector means of a selected one of said cables to connect said control unit and the selected cable, and
 (ii) control means for selectively directing both a first continuity evaluation quantity of electromagnetic radiation and a second load evaluation quantity of electromagnetic radiation sequentially into each of said lines at said first end of the selected cable, said first continuity evaluation quantity of electromagnetic radiation being relatively minimal in degree by comparison to the amount of electromagnetic radiation normally conducted by each of said lines of the selected cable under normal load conditions and serving merely to confirm that such electromagnetic radiation reaches the second end of the selected cable, said second load evaluation quantity of electromagnetic radiation being relatively similar in degree to the amount of electromagnetic radiation normally conducted by each of said lines of the selected cable under normal load conditions;

(b) a transportable detector unit independent of said control unit and including:
 (i) means for attaching said detector unit to said second connector means of the selected cable to connect said detector unit and the selected cable, and (ii) sensor means for measuring the quantity of electromagnetic radiation reaching said second end of the selected cable in each of said lines when said control means directs said first and second quantities of electromagnetic radiation into each of said lines of said first end of the selected cable, said sensor means measuring continuity evaluation fault detection information for each of said lines when said control means directs said first continuity evaluation quantity of electromagnetic radiation sequentially into each of said lines at said first end of the selected cable, said sensor means measuring load evaluation fault detection information for each of said lines when said control means directs said second load evaluation quantity of electromagnetic radiation sequentially into each of said lines at said first end of the selected cable;

(iii) storage means for storing, as continuity evaluation-reference information and load evaluation-reference information for each of said lines, nominal quantities of electromagnetic radiation measured for each of said lines at said second end of a plurality of said identical cables when said first and second quantities of electromagnetic radiation respectively are directed into said lines at said first end of said plurality of identical cables, said storage means including means for recalling said continuity evaluation-reference information and load evaluation-reference information stored therein for each of said lines; and (iv) comparison means coupled to said sensor means and coupled to said storage means for comparing said load evaluation-fault detection information and continuity evaluation-fault detection information with said recalled reference measurement information and generating load fault-identification information and continuity fault-identification information in response to such comparison.

2. The maintenance system of claim 1, wherein (a) said electromagnetic radiation comprises electricity;

(b) said lines comprise electrically conductive wire of a size selected from a group consisting of twelve to thirty gauge wire; and, (c) said second quantity of electromagnetic radiation is in a range of 0.5 to 15 amperes.

3. The maintenance system of claim 2 wherein said first continuity evaluation quantity of electromagnetic radiation is an electrical current in a range of approximately 3 milliamps to 30 milliamps.

4. A method of detecting, in each of a plurality of generally identical cables, faults which cause intermittent attenuation of electromagnetic radiation transmitted through the cable, each of said cables including a plurality of lines extending the length of the cable, each of said cables having a first end including first connector means and having a second end including second connector means, each of said plurality of lines terminating at said first and second connector means, each of said first and second connector means normally being removably connected to mating means in a system, said method comprising the steps of:

(a) generating continuity evaluation-reference measurement information and load evaluation-reference measurement information for said cables by:

(i) detaching said first and second connector means for a plurality of said identical cables from said mating means;

(ii) directing a first continuity evaluation quantity of electromagnetic radiation sequentially into said lines of said identical cables at said first end of each cable at said first connector means thereof to generate continuity evaluation-reference information for each of said lines of said identical cables at the second ends thereof, said first continuity evaluation quantity of electromagnetic radiation being relatively minimal in degree by comparison to the amount of electromagnetic radiation normally conducted by each of said lines of said identical cables under normal load conditions and serving merely to confirm that such electromagnetic radiation reaches the second end of each such cable;

(iii) directing a second load evaluation quantity of electromagnetic radiation sequentially into said lines of said identical cables at said first end of each cable at said first conductor means thereof to generate load evaluation-reference information for each of said lines of said identical cables at the second ends thereof, said second load evaluation quantity of electromagnetic radiation being relatively similar in degree to the amount of electromagnetic radiation normally conducted by each of such lines of said identical cables under normal load conditions;

(iv) measuring the quantity of electromagnetic radiation reaching said second end of the cable in each of said lines for each of said identical cables at said second connector means thereof when said first and second quantities of electromagnetic radiation are directed into said lines at said first end of each cable, said measured quantities representing continuity evaluation-reference information and load evaluation-reference information, respectively, for each line of said plurality of identical cables;

(v) storing as continuity evaluation-reference information the quantities of electromagnetic radiation measured at said second end of the cable when said first quantity of electromagnetic radiation is directed into said lines in Step (ii);

(vi) storing as load evaluation-reference information the quantities of electromagnetic radiation measured at said second ends of the cable when said second quantity of electromagnetic radiation is directed into said lines in Step (iii);

(b) generating continuity evaluation-fault detection information and load evaluation-fault detection information in a selected one of said cables by:

(i) detaching said first and second connector means of said selected cable from said mating means;

(ii) sequentially directing through each of said lines in said selected cable said first quantity of electromagnetic radiation;

(iii) measuring as continuity evaluation-fault detection information the quantities of electromagnetic radiation measured in said lines at said second end of the selected cable when said first quantity of electromagnetic radiation is directed into said lines in Step (b) (ii);

(iv) recalling said continuity evaluation-reference information and comparing said continuity evaluation-reference information with said continuity evaluation-fault detection information to generate continuity fault-identification information, said continuity fault-identification information identifying variances between said continuity evaluation-reference information and said continuity evaluation-fault detection information;

(vi) measuring as load evaluation-fault detection information the quantities of electromagnetic radiation measured at said second ends of said selected cable when said second quantity of electromagnetic radiation is directed into said lines in Step (b) (v) and, (vii) recalling said load evaluation-reference information and comparing said load evaluation-reference information with said load evaluation-fault detection information to generate load fault-identification information, said load fault-identification information identifying variances between said load evaluation-reference information and said load evaluation-fault detection information.

5. The method of claim 4, wherein
(a) said electromagnetic radiation comprises electricity;
(b) said lines comprise electrically conductive wire of a size selected form a group consisting of twelve to thirty gauge wire; and,
(c) said second quantity of electromagnetic radiation is in a range of 0.5 to 15 amperes.

6. The method of claim 5 wherein said first continuity evaluation quantity of electromagnetic radiation is an electrical current in a range of approximately 3 milliamps to 30 milliamps.

* * * * *